(12) United States Patent  (10) Patent No.: US 7,238,597 B2
Williams  (45) Date of Patent: Jul. 3, 2007

(54) BORON ION DELIVERY SYSTEM

(75) Inventor: James M. Williams, Knoxville, TN (US)

(73) Assignee: Brontek Delta Corporation, Radford, VA (US)

( * ) Notice: Subject to any disclaimer, the term of this patent is extended or adjusted under 35 U.S.C. 154(b) by 130 days.

(21) Appl. No.: 10/667,277

(22) Filed: Sep. 19, 2003

(65) Prior Publication Data
US 2004/0119025 A1 Jun. 24, 2004

Related U.S. Application Data

(60) Provisional application No. 60/415,164, filed on Sep. 27, 2002.

(51) Int. Cl.
G21K 5/10 (2006.01)
H01L 21/26 (2006.01)
H01L 21/425 (2006.01)

(52) U.S. Cl. .................. 438/513; 438/514; 250/492.21

(58) Field of Classification Search ................ 438/513, 438/514; 250/492.1, 492.2, 492.21, 492.3
See application file for complete search history.

(56) References Cited

U.S. PATENT DOCUMENTS

| | | | |
|---|---|---|---|
| 3,960,605 A * | 6/1976 | Beck et al. .................. 438/514 |
| 4,318,213 A | 3/1982 | Blount | |
| 4,371,587 A | 2/1983 | Peters | |
| 4,415,916 A * | 11/1983 | Protic et al. ................. 257/430 |
| 4,676,847 A | 6/1987 | Lin | |
| 4,682,564 A | 7/1987 | Cann | |
| 4,692,998 A | 9/1987 | Armstrong et al. | |
| 4,791,005 A | 12/1988 | Becker et al. | |
| 5,037,767 A | 8/1991 | Daniel | |
| 5,198,373 A | 3/1993 | Yoshino | |
| 5,199,994 A | 4/1993 | Aoki | |
| 5,517,084 A * | 5/1996 | Leung .................... 315/111.81 |
| 5,558,718 A * | 9/1996 | Leung .................... 118/723 E |
| 5,598,025 A | 1/1997 | Murakoshi et al. | |
| 5,672,541 A * | 9/1997 | Booske et al. .............. 438/513 |
| 5,709,745 A | 1/1998 | Larkin et al. | |
| 5,763,320 A | 6/1998 | Stevens et al. | |
| 5,866,472 A | 2/1999 | Moslehi | |
| 5,885,904 A | 3/1999 | Mehta et al. | |
| 5,913,131 A | 6/1999 | Hossain et al. | |
| 5,964,943 A | 10/1999 | Stein et al. | |
| 5,977,552 A * | 11/1999 | Foad ..................... 250/492.21 |
| 6,090,590 A | 7/2000 | Kao | |
| 6,097,079 A | 8/2000 | Hossain et al. | |
| 6,133,120 A | 10/2000 | Miyajima et al. | |
| 6,150,248 A | 11/2000 | Sekiguchi et al. | |
| 6,239,440 B1 * | 5/2001 | Abbott .................... 250/423 R |
| 6,300,209 B1 | 10/2001 | Oh | |
| 6,380,012 B1 | 4/2002 | Chen et al. | |
| 6,391,694 B1 | 5/2002 | Zhang et al. | |
| 6,417,031 B2 | 7/2002 | Ohtani et al. | |
| 6,436,785 B2 | 8/2002 | Brown et al. | |

(Continued)

Primary Examiner—Zandra V. Smith
Assistant Examiner—Pamela E Perkins
(74) Attorney, Agent, or Firm—James W. Hiney

(57) ABSTRACT

A boron ion plasma, generated by use of a cathodic arc, is manipulated and delivered to a large flat product such as a silicon wafer with boron ion energies suitable for incorporation of boron atoms into solid state devices as one of the key steps in manufacturing solid state electronics and with uniformity of boron dose over the area suitable for the scale of manufacturing desired.

36 Claims, 16 Drawing Sheets

U.S. PATENT DOCUMENTS

| | | |
|---|---|---|
| 6,562,418 B2 | 5/2003 | Morrow et al. |
| 6,562,705 B1 * | 5/2003 | Obara et al. ............ 438/535 |
| 6,904,509 B2 | 6/2005 | Chang |
| 6,905,947 B2 * | 6/2005 | Goldberg ............ 438/513 |

* cited by examiner

BORON ION DELIVERY SYSTEM

This invention relies upon an earlier filed provisional application, Ser. No. 60/415,164, filed on Sep. 27, 2002, with the title BORON ION DELIVERY SYSTEM, the inventors of which are the same two individual inventors in this instant application. This application incorporates the above provisional application by reference and reliance is had to the filing date thereof.

This invention involves a boron ion plasma, generated by use of a cathodic arc, which is manipulated and delivered to a large-area flat product (e.g. a silicon wafer of up to several inches in diameter) with boron ion energies suitable for incorporation of boron atoms into solid state devices as one of the key steps in manufacturing of solid state electronics and with uniformity of boron dose over the area suitable for the scale of manufacturing desired. The invention involves a melding of the cathodic arc method of ion generation with the need for boron ion doping in the semiconductor industry which that has not been tried before. The necessary manipulation and conditioning consists of: (1) expanding the ion plasma geometry from that generated in the ion source to that needed for bombardment of products of large area. (2) Providing for acceleration of boron ions to the necessary energy. (3) Providing for elimination of boron "macroparticles" (MP's) from either the plasma stream or the ion beam (depending on manifestation) that treats the product. Rendering and operation of the boron cathodic arc to a commercial level of viability also formed part of the development. Other factors requiring cognizance in design include ion dosimetry, X-ray biological hazard due to counter-accelerated secondary electrons produced as a result of ion acceleration, uniformity of treatment over the area, wafer cooling and other factors. Operation results, which provide information pertinent to the more basic design issues are presented. A "test bed" system for generation of the arc ion plasma, experimental determination of pertinent parameters, exploration of arc reliability, production of test samples and other experiments has been constructed and operated extensively. A sample of single crystal semiconductor silicon wafer material has been "shallow junction" implanted with boron and the results have been carefully analyzed with respect to boron incorporation and other factors. The results have very favorable indicators relative to the existing technique. Design approaches that achieve the stated goals are presented and their operation are described. These integrated designs are holistic and synergistic with respect to the design factors identified. The designs include components based on highly modified and they include new features. The integrated designs are innovative, being singularly suited to adaptation of the cathodic arc ion generation process to the doping function, and therefore being materially different from other systems/methods and processes for delivering ions to semiconductor products (silicon wafers, most importantly) or to any other products. Part of the effort has involved improvement of synthesis methods and reliability of boron cathodes (these results being covered by another patent [1]). Taken as a whole, this operation of the existing system, this reduction to practice by ion implantation of boron into silicon, the projection of viable designs for filtering of macroparticles and expansion to large wafers, the knowledge, application and crediting of prior arts, and demonstration of other expertise in the field, amount to invention of "boron ion implantation doping of semiconductor materials by use of the boron cathodic arc."

BACKGROUND AND FURTHER INTRODUCTORY REMARKS

The arc ion source, in general, has been known as a method for plasma generation (A plasma consists of a gas-like dispersion of atomic ions and free electrons in which the number of free electrons and the number of positive ions are approximately equal.) for over one hundred years, but to our knowledge, the boron cathode has been used by only one group previously [2], besides the present effort. That effort [2] was directed towards production of boron nitride mechanical coatings. Arc ion sources differ from other plasma sources in that the plasma is generated by an electron arc from solid material in an arc gap, which otherwise, may consist of good vacuum. Hence the other name, "vacuum arc". Other ways of generating ion plasma generally work by introducing suitable energy (RF or microwave irradiation, hot or cold cathode electrons, etc.) to gas at somewhat low pressures, but not at a vacuum in the sense of the vacuum arc source. A list of intrinsic advantages and disadvantages could be compiled, but only a few factors actually dominate design considerations for applications to semiconductors for the respective types of ion generation. The arc produces practically 100% ionization and a very high absolute rate of plasma generation, whereas plasmas that originate as gases contain a small fraction of ionized atoms and many neutral gas atoms. The arc source produces "macroparticles" (MP's), which are particles of solid material of some microns in diameter. They consist of cathode material and are negatively charged. (The ions are positively charged.) The gaseous plasmas contain chemically unwanted neutral atoms, chemically unwanted ions, chemically desired neutral atoms and chemically desired ions. Chemical separation issues, vacuum issues, and ion economy are the ones that ultimately have the most to do with the configuration of ion implanters based on gaseous plasmas (existing practice). Macroparticles is the disadvantage that, in many ways, may influence design for arc sources, and therefore can be considered as somewhat symmetrical, as a drawback, to undesired atoms in the gaseous source, as far as design factors are concerned. The present effort was based on two premises: (1) that the boron arc source could be developed to a reliable level of operation and (2) that once that was done, the advantages could outweigh the disadvantages, relative to existing practice, by use of suitable design of delivery systems.

DESCRIPTION OF THE BACKGROUND ART

U.S. Pat. No. 6,562,418, issued in May of 2003, is entitled Mircrowave processing of pressed boron powders for use as cathodes in vacuum arc sources is interesting but does not anticipate or suggest the instant inventions.

U.S. Pat. No. 6,436,785 mentions B and P but not the source.

U.S. Pat. No. 6,417,031 is for a method of manufacture using a laser to recrystallize A-Si impurities including dopants used as catalysts.

U.S. Pat. No. 6,391,694 is for a method of manufacturing integrated circuits and uses TFTs-high speed B Ions and says that all embodiments of the process utilized Boron containing gases.

U.S. Pat. No. 6,380,012 shows a method for boron diflouride plasma doping for ultra shallow junctions.

U.S. Pat. No. 6,300,209, shows a method of manufacture using selective epitaxial growth.

U.S. Pat. No. 6,150,248 is for a method of fabricating semiconductor devices involving cobalt selicilide film on Si.

U.S. Pat. No. 6,133,120 shows boron doped P type single crystal SiC and the boron implanted either in situ as gas in epitaxy or via implantation.

U.S. Pat. No. 6,090,590 is for direct gas doping.

U.S. Pat. No. 5,964,943 is a method of producing boron doped monocrystalline SiC. Mentions gas molecules.

U.S. Pat. No. 6,904,509 mentions a nodic in oxidation process.

U.S. Pat. No. 6,097,079 is a boron implanted dialectric and implants a specific isotope of boron.

U.S. Pat. No. 5,913,131 is similar to U.S. Pat. No. 6,097,079.

U.S. Pat. No. 5,885,904 is for a method to incorporate oxide enhancement dopants using gas immersion laser doping.

U.S. Pat. No. 5,866,472 is like U.S. Pat. No. 6,090,690.

U.S. Pat. No. 5,763,320 uses boric acid to dope a semiconductor device.

U.S. Pat. No. 5,709,745, uses compound semiconductors and control doping with gases of Si and dopant.

U.S. Pat. No. 5,672,541, to Booske et al, mentions use of solid boron but differs materially from the approach of the instant invention. The method does not generate a boron plasma or boron ions so no "implantation" takes place. The process does not involve a magnet nor does it produce any boron ions.

U.S. Pat. No. 5,598,025 discusses building a twelve boron atom icosahedron structures in silicon.

U.S. Pat. No. 5,199,994 discusses an impurity doping apparatus using diborane.

U.S. Pat. No. 5,198,373 is a process for manufacturing a semiconductor device.

U.S. Pat. No. 5,037,767 discusses a method of manufacture by ion implantation using ion sensitive resist.

U.S. Pat. No. 4,791,005 is for a method of manufacturing of SiO layers doped with boron, etc.

U.S. Pat. No. 4,692,998 is for a process for fabricating semiconductor components to make monolithic arrays of elements.

U.S. Pat. No. 44,682,564 is for an arc-jet transforming working fluid into fully ionized plasma but is different from the instant invention and no suggestive thereof.

U.S. Pat. No. 4,676,847 shows controlled boron doping of silicon trenches and heat treatment is used to remove or retain added layers.

U.S. Pat. No. 4,381,213 discusses doping large numbers of wafers closely spaced and immersion in boron chloride and water mixed.

U.S. Pat. No. 4,371,587 discusses a low-T process for depositing oxide layers by photochemical vapor deposition.

An important reason that boron arcs have not been employed before is because of the technical difficulty in procuring and operating boron as an arc cathode. Solid boron has poor electrical conductivity, poor heat conductivity, typically poor purity (as consolidated material) and unacceptable mechanical integrity (as fabricated), with all of these disadvantages being weighed against possible benefits. Successful operation of boron as a cathode (for more than singular research projects, as was done in reference 2) depended on improvement of boron consolidation techniques and performance (covered by another patent with one of the same inventors [1]), and it depends on other arts, regarded as trade secrets, which are not necessarily patentable. In addition, the new systems/method/process employs, adapts, improves and modifies a menu of existing arts for incorporation into system design and assemblages to achieve the desired application. In so doing, some of these component parts may undergo design changes and improvements, which might be claimed as inventions in themselves. The claim to novelty for the present invention, however, does not necessarily rest on the idea that any component is an invention, but rather that the whole approach is new. Thus, although some components and systems described here may differ sufficiently from previous designs, that they can be regarded as inventions, we are concentrating on the broader invention, that is, any application of cathodic arc to the specific doping problem presented by boron. Techniques may include our creations and may include separate inventions of others in the future. The relevant prior arts include boron cathode operation [1,2], possibly, but not necessarily, certain macroparticle (MP) filtering techniques [3,4 e.g] the principle of plasma immersion ion implantation extraction [5], and other, more mature, arts of plasma and ion manipulation such as plasma containment, beam extraction, aperturing, beam transport, high voltage power circuitry, nuclear and atomic physics instrumentation, and vacuum practice. As with ion implantation from gaseous plasmas, experience obtained for isotope separation for uranium weapons material during and after World War II by the Manhattan Project is relevant. This research during World War II developed ion extraction from plasmas and, in particular, proved the possibility of ion beam transport over large distances without unacceptable beam spreading. This development, now some sixty years old, is in the public domain. The name of the pertinent device was the "Calutron." In our case, the relevancy has to do with proving that a "ribbon" ion beam of over 30 cm in length can be transported over considerable distance without unacceptable spreading.

The herein described new approach, use of boron arc-generated plasmas, is intended to replace or supplement existing practice. At present, the manufacturing step of boron doping of semiconducting devices is performed by "beam" types of systems in which positive ion beams are extracted from small gaseous plasma sources (as described above) known as "Freeman" sources (or variants thereof) [6 e.g]. These are hot-filament sources in which the plasma is generated by electrons from the filament, with the electrons being accelerated to modest energies (100 eV e.g.) before interacting with the feed gas to form plasma. One limiting factor has to do simply with the shape of a beam that can be injected into the analyzing magnet for separation of unwanted chemical species by the principle of magnetic mass spectrometry. To maintain magnet focus and uniformity of field, the beam must have a cross section that is essentially an elongated rectangle with limits on both dimensions. Magnet dees cannot be too far apart, (or the field will not be uniform for dees of suitable area) and ions cannot enter too far off-axis laterally or there will be limitations on atomic mass resolution. This limitation affects other aspects of the delivery system. Other manipulations include electrical rastering of beams and mechanical scanning of product. These processors cost some $2M each to the final customer. Because of the cost and complexity of these systems, a second technique, plasma immersion ion implantation, has recently been marketed on a limited basis [7], but has not yet reached commercial maturity [8]. This latter development is a variation on the general technique of plasma immersion extraction mentioned above [5], and when applied for gaseous plasmas on semiconductors, is based in part on the idea that selected chemical contaminations might be acceptable [8]. Application of this plasma immersion technique, but with our boron arc plasma generation instead of gaseous plasma generation, would not need such a compromise.

Boron Arc Source and System Design

For the first time in the history of ion implantation doping of semiconductors, the present method teaches a different approach at the very front end of the ion-implantation process. Then, the downstream designs and design principles are based on how this new approach logically feeds through systems designs. First, the plasma is pure ionic boron, which can be produced at a very high plasma generation rate relative to that of the existing technology (Freeman or Freeman+White variation). That means an effective boron ion current of up to 1 ampere, if necessary. That is a factor of more than 100 more than for present practice. This result has implications regarding design principles. First, the analyzing magnet can be eliminated because of the purity of the boron plasma. Secondly, plasma intensity can be sacrificed or traded off against other design goals, such as uniformity of treatment for large areas or filtering of MP's. Third, the absence of gas for generating plasma simplifies vacuum pumping and makes available ion and plasma transport designs that otherwise are not available. As stated, in some of our designs, techniques for filtering of MP's may or may not borrow to a degree from previous arts, but in integrated form, are new. The idea that a filter could be constructed is what we actually derived from other designs. In any case, for boron, it is essential that filters provide measures for positive trapping of MP's that are separated from the plasma because of the elastic rebounding that has been observed in the present experiments. This is in contrast to the existing practice for metal arcs. For these metal arcs, it has been assumed that particles are liquid or else hot and sufficiently ductile that they splat down on the vacuum walls or other surfaces, and do not return to the system, once filtered. Our practice indicates that this assumption is clearly not true for boron, and therefore systems must incorporate appropriate final trapping for the filtered particles. This scattering of the particles virtually rules out the most common filter design in the literature, that of the curved toroid for steering plasma, while allowing MP's to go straight [3 e.g.]. The robust toroidal windings, required for that technique, scatter too many particles.

Effects on the Target (Silicon)

In addition to the design and economic advantages of the processor itself, there are (potentially but not necessarily) fundamental differences in effects on the silicon substrates, due to the high potential rates of implantation for the arc source. To the extent that these effects have been identified thus far in the reduction to practice, they appear mostly beneficial. These effects will be identified below. Our new technology is capable of encompassing the existing range of process parameters, and is also capable of a greatly expanded range, if such a range is beneficial. For example, high, localized pulsed heat due to the ion heating during the ion implantation might be possible.

Non-obviousness, Novelty, Creativity, Intellectual Merit, Risk and Benefit

The present invention seeks to secure an important role in one of the most innovative, most competitive, most economically important and most widely scrutinized industries in the world, with commensurate intellectual, academic, industrial, and financial resources in play. If the technique were obvious, it would have been invented.

The arc source has been known as a method of generating ions, in general, for over one hundred years, but has not been applied for boron cathodes because of practical difficulties and the absence of a vision. The present development is, in part, an outgrowth of research on boron carbide coatings [9], but the step to improve and operate pure boron arcs with an eye to boron doping of semiconductors is a threshold step. It is a step that might conceivably have been made by others, with more resources, but has not heretofore been made despite enormous economic incentive. The sales and maintenance of the one type of tool, ion implanters, to the semiconductor industry has a value of some $1.2 to 2B per year, depending on cycles in the economy. Moreover, in terms of broader economic trends, the limit to future growth in the world cannot yet be perceived. Although these systems are versatile and can implant more than one atomic species, dedication is common, particularly for boron, since it is overwhelmingly the most common p-dopant [8]. Thus, approximately half the value cited above can be attributed to equipment, repairs and maintenance for the sole step of doping with boron. That of course does not count the tremendous value added due to the ion implantation steps in production of the integrated circuits that make use of the equipment. It is true that system features, such as mass analysis, wafer scanning, etc., other than ion generation itself, constitute a large fraction of the system costs mentioned above. It is also true, however, that the cathodic arc method of ion generation causes and enables important changes in system design and resultant cost savings, in accordance with the present descriptions. If the feasibility were obvious, the task would have been accomplished earlier in view of the large potential benefit. Combinations and assemblages of components that address the purpose of semiconductor doping by use of the boron arc source have not been reported. As stated, that is because the potential of the ion source, itself, has not been recognized by others, even though there is the one publication [2]. The authors of that publication have, themselves, apparently not recognized the potential of the present application. Recognition of potential advantages is a key factor in the value judgment to pursue an innovation. This value judgment entails an assessment of the economic risk versus the possible benefit. Novelty manifests itself first in the decision to pursue the goal, and then in the reduction to practice that was performed (see below) and then in the other designs, combinations and assemblages that are presented. In addition, beyond the simplicity and cost advantages discussed, there are also potential fundamental and otherwise more difficult to achieve benefits for the product itself, which have provided motivation. These include lower voltage energy ranges available (for shallow-junction doping), less sputtering, less total radiation damage, but higher rates of radiation damage, and ease of neutralization of the surface. Because of the 100% ionization and purity of the plasma, there is less scattering due to ion-ion collisions and ion-atom collisions in the plasma. That means less isotropic entry into the surface in situations that will be described. Some advantages, such as normal ion entrance without product manipulation, or the possibility of neutralization, result from transporting to and in part treating the surface with the whole plasma in some cases. That means use of electrons and positive ions both, rather than just extracted positive ions, as in the beam system.

It is submitted that in virtue of the equipment constructed and operated, the experiments that have been performed, the observations that have been made, the ion implantation doping and analysis of single crystal silicon material that has been performed, together with the expertise in the field of the inventors, the example embodiments that have been designed, the recognition, incorporation and acknowledgement of prior arts, and the exercise of appropriate initiative and creativity, that *Boron Ion Implantation Doping of Semiconductor Device Materials by Use of the Boron Cathodic* (a.k.a. Vacuum) Arc (any and all processes) has been invented. The present reduction to practice was with a pure boron cathode, but includes all possible composition cathodes, such as boron-carbide or boron-silicide, where the other constituents are presumed to be either harmless or possibly beneficial in some way.

The whole effort has resulted in the following inventions.
1. There is novelty in the process, summarized above, of applying the boron cathodic arc source to doping of semiconductors, and therefore the application of systems of the present design which start with arc generation of boron ions as an initial step.

Any methods based on said systems and execution of the doping process are novel as well.
2. Whole system configurations of the design shown and described herein, with component arrangements, MP filter designs, broad geometric and spatial aspects, etc., suitable for processing of semiconductor components (silicon wafers) which includes means devices described in sections K1, K2 and K3 herein.
3. The particular MP filtering design described in manifestation K1 below. The design involves a relatively low voltage ion acceleration and a simple electrostatic deflection of the boron ion beam out of the stream of macroparticles. Among the large number of existing macroparticle filter designs, this simple concept has never been tried before.
4. The idea of slowing down the generated plasma ions for the sake of advantages claimed and the device intended to perform the retardation, and the system identified for that purpose in K2 below.

Advantages (including fundamental, economic, independent and dependent advantages in one or more design manifestations and parameter ranges)
1. essentially 100% ionization of plasma as boron ions (no neutrals or chemical impurities)
2. economies because of no mass analysis
3. economies due to simplified product manipulation
4. economies due to other capital costs of equipment.
5. higher throughput of wafers.
6. plant economies because of smaller footprint of equipment.
7. plant economies due to compatibility with other tools.
8. economies due to simplified maintenance of equipment.
9. less sputtering of the silicon and resulting higher doping levels possible due to no unwanted atoms and due to surface deposition of B during "down" part of cycle (depending on manifestation). This is a fundamental advantage.
10. automatic charge neutralization, because during the down part of the cycle plasma electrons can return to the target (this is for the "immersion" manifestation, see below)
11. less isotropy for intended directional implants, because of fewer unwanted atomic and ionic collisions in the plasma.
12. fewer problems with sputter contamination from system parts due to having only boron ions as sputter ions and due to design options available.
13. fewer radiation produced defects, less enhanced diffusion, better controlled implantation profiles as a result.
14. controllable instead of adventitious foreign atoms when desired, for amorphization, e.g.
15. unwanted ions do not comprise part of instrument current load.
16. potentially better and simplified dosimetry.
17. real safety, presumptive safety, and simplified safety/environmental regulatory requirements due to benign solid feed material instead of toxic or carcinogenic gases. Gases used in boron plasma generation by methods other than cathodic arc are very dangerous. The gas decaborane, for example, is presently under serious consideration as a gas for plasma generation for shallow junction doping [10].
18. better potential for continuing upgrade of the technique as arts improve, because of robustness of the ion source.
19. possible applicability of similar technology for metallization or substitutes for other PVD depositions lends economies of scale and plant design.
20. better prospects for controlled angles of entrance, normal and otherwise, for treatment of trenches or other topographies.
21. good vacuum in vicinity of the ion acceleration stage will result in little charge exchange at that point, and less hazard due to X-rays from back acceleration of electrons.

OBJECTS OF THE INVENTION

Having discussed the general invention, the prior art and the benefits to be derived from the invention, the following objects are promulgated.

It is an object of this invention to provide a novel boron ion delivery system.

It is a further object of this invention to provide an improved system and method of boron doping of semiconductor devices by use of a boron cathodic arc ion source.

It is a still further object of this invention to provide an improved system and method for boron ion implantation of semiconductor device materials by use of the boron cathodic arc ion source.

Still further, it is an object of this invention to provide a boron ion delivery system and method comprised of equipment and methods for ion implantation doping of semiconductors by improvement of the cathodic arc type of boron ion source and by suitable manipulation of the generated ion plasma to allow for uniform implantation of large areas and to prevent contamination of the product.

It is yet another object of this invention to provide a macroparticle filter based on electrostatic steering of beam away from the particles.

Still another object of this invention is to provide an electrostatic device placed so as to slow down ions entering a plasma process chamber after the ions have been generated and transported to the chamber.

Another object of this invention to provide a unique boron ion doping system with component arrangements such as MP filter designs, broad geometric and spatial aspects suitable for processing of semiconductor components such as silicon wafers.

A still further object of this invention is to provide a unique process of slowing down a generated plasma ion to effect the goal of this invention.

Another object of this invention is to provide 100% ionization of plasma as boron ions.

A still further object of this invention is to provide economies in boron ionization of silicon wafers.

A final object is to provide a system and method having all the advantages listed as no.'s 1 through 21 above.

These and other objects will become apparent when reference is made to the following description and the figures, in which.

DETAILED DESCRIPTION OF THE INVENTION

Figure 1:
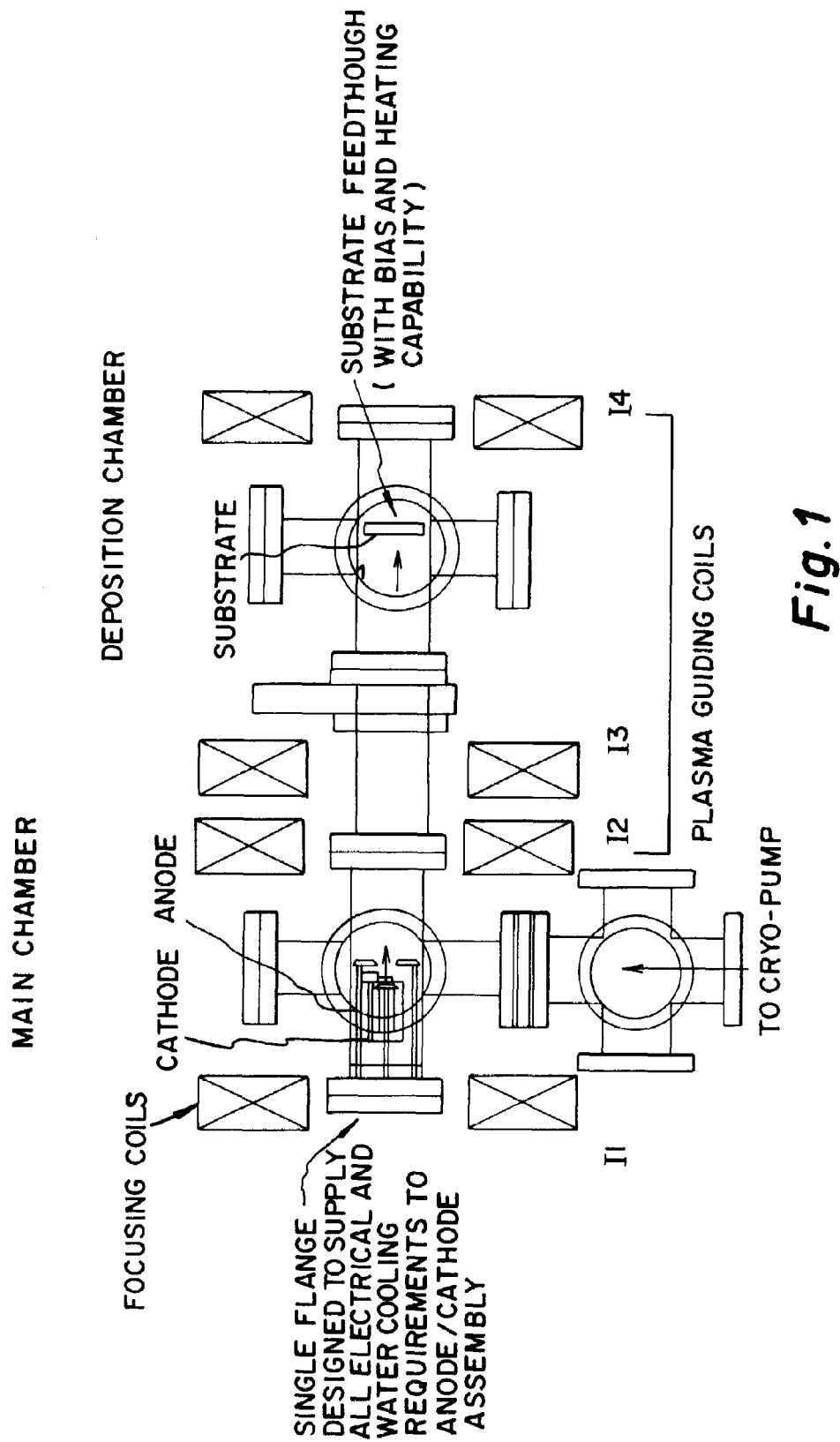
FIG. 1 is a overall diagrammatic view of the equipment of this invention.

An invention (or inventions) is/are considered to have been made by this date because of successful construction, analysis, operation of key elements, and pertinent scientific observations. These results, in conjunction with existing literature, noted at the end of this specification, reliably indicate the way to other systems designs contemplated by this invention.

Boron cathodes of sufficient purity and excellent reliability have been synthesized. Before the present effort, consolidated materials of desired purity were supposedly offered by sellers, but when procured, were unsuitable due to purity and mechanical integrity. These consolidated materials were not offered as cathodes. They were offered as sputter targets, since boron cathodic arcs have not, in general, been a market, as they have not been operated. However, changing the geometry during manufacture to that suitable for cathodes would have, hypothetically, not been satisfactory, if the sputter target technology itself had otherwise been satisfactory. We were not able to procure clean and strong sputter targets from any of several existing vendors that were tried. [1]. That success is important in helping to make the present effort to be actually practical, instead of only innovative.

A system or systems involving various cathode and anode arrangements have been assembled and operated at length. These experiments have included doping of semiconductor silicon (see below) and production of boron coatings on other substrates. As a result, information on MP behavior, plasma generation and transport, and other information, useful in designs of prototypes, has been gained.

One such system constructed includes a solenoidal or Helmholtz coil arrangement, which produces an axially directed magnetic field, and within that directional field the plasma is more or less contained for transport in a straight direction down a pipe. This partial containment allows direction over some length of the plasma into a process chamber without undue loss of plasma. As a physical description of the plasma, this is a quasi-neutral plasma with approximately equal numbers of ions and electrons, in transit, at about 40 eV ion energy. That is with no target bias or acceleration other than what occurs in the arc which is in contrast to a positive ion beam with so called "tramp" electrons, which represents existing practice. Also the plasma is essentially 100% ionized. However, for the "shallow junction implanted" silicon sample described below, the sample was biased at 500 V relative to the streaming plasma in a plasma immersion mode of operation [5]. This system is a "test bed," not a wafer processor in itself. However, our ion implantation of silicon was done in this system.

Undesirable solid MP's (1 to 25 microns in diameter), which are emitted from the cathode, were observed as expected. As was stated, these particles are in principle the most important intrinsic disadvantage of the cathodic arc process for applications to semiconductors. The transport length, in itself, together with a suitably chambered mechanical baffle system, may constitute the first stage of MP filtering in some embodiments, because the plasma remains directed, while the angular dispersion of the particles will allow many to be captured in the baffled chambers. Observations of MP behavior have indicated criteria for MP filtering and indicate that the particle behavior is different from what would have been expected based on observations for other material combinations. (We are relying on the literature [3,4 e.g]) for observations of this) Pure boron is very hard even as a hot MP, and has a high melting point. Thus, observations indicate that boron MP's recoil elastically from surfaces in the chamber and that they stick to surfaces much less readily than do MP's of other materials. The MP's adhered to 1100 Al alloy and to chemically pure Ti but not to hard chrome plate. Hard chrome plate has a hardness of about 10 GPa, about the same as that of silicon, whereas the two nearly-elemental metals, 1100 aluminum and CP—Ti, are rather soft. Thus, while MP's are undoubtedly a factor in the semiconductor application, many particles recoil from silicon and other hard materials. They may leave microscopic evidence of damage, however, such as cratering or pock marks. This result suggests that mechanical damage might be unacceptable even when particles do not stick. Silicon coated with photoresist has not yet been studied in the present experiments, but it seems likely that particles would melt through and stick into the resist coating in many instances. Taken as a whole, prudence, and the view to a range of semiconductor applications, dictates that a rigorous filtering of MP's is needed in equipment design.

Analysis of boron coatings deposited on several substrates by use of the system and the observation of plasma color indicate the likelihood of sufficient boron purity for the semiconductor application. Analysis of the doped silicon sample (see below) supports the e same conclusion.

Doping of Silicon by Use of the Existing System

Figure 2:
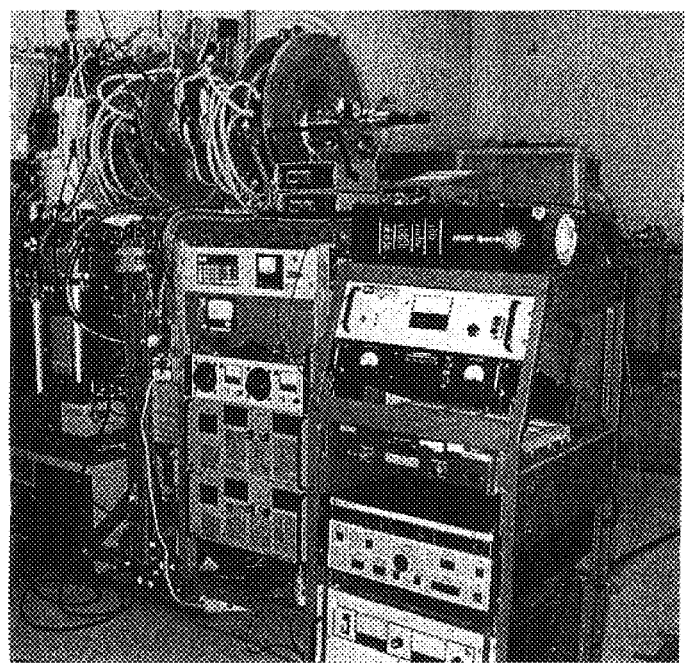
FIG. 2 is a photograph of the invention equipment.

The existing system provides for flexibility in configuration, so as to allow for testing of various ideas. The system does not provide for complete MP filtering in any configuration that has been used thus far. For the doping of the single crystal silicon material, for which analysis data will be given below, the scheme can be most closely described as "plasma immersion extraction to the sample from a partially directed plasma," a scheme that, in principle, resembled that of K2, described below. FIG. 1 is a schematic diagram of the system and FIG. 2 is a photograph of the system. The partially directed plasma was confined in a transport pipe by an axially directed magnetic field, which directed the plasma to the sample from the arc source. The sample (labeled substrate) was positioned in the deposition chamber some 60 cm from the cathode. Pinching or expansion of the plume at the sample position can be controlled somewhat by the current in I4. Some particle filtering was provided by the transport length and baffling within. The extraction voltage was 500 V, consistent with published energies needed for "shallow junction doping." [10 e.g.]. The 500-V extraction energy was achieved by bias of the sample itself, in accordance with the immersion principle [5]. Since the plasma stream already had a distribution of ion energies with an average of about 40 eV (but not completely directed), it can be assumed that the final ion energy was somewhat above 500 eV in the direction normal to the sample. The total exposure time was 2 s, divided into two each 1-s pulses. The integrated current, if assumed to be all boron ions, would indicate an implantation fluence of approximately 3.5E17/cm$^2$. There may be possible errors, which will not be discussed, to this first-order dosimetry method. Streaming plasma electrons would have, of course, been repelled by the bias during the extraction pulse, and would not have contributed to the current integration. The analyses below indicate that the results, in terms of damage produced by the implanted boron and the range of incorporated boron atoms are highly consistent with the effects expected from this ion energy and fluence, when evaluated in terms of previous theory and practice. Therefore, it is concluded that doping with the plasma is perfectly viable and that a successful demonstration has occurred.

Figure 3:
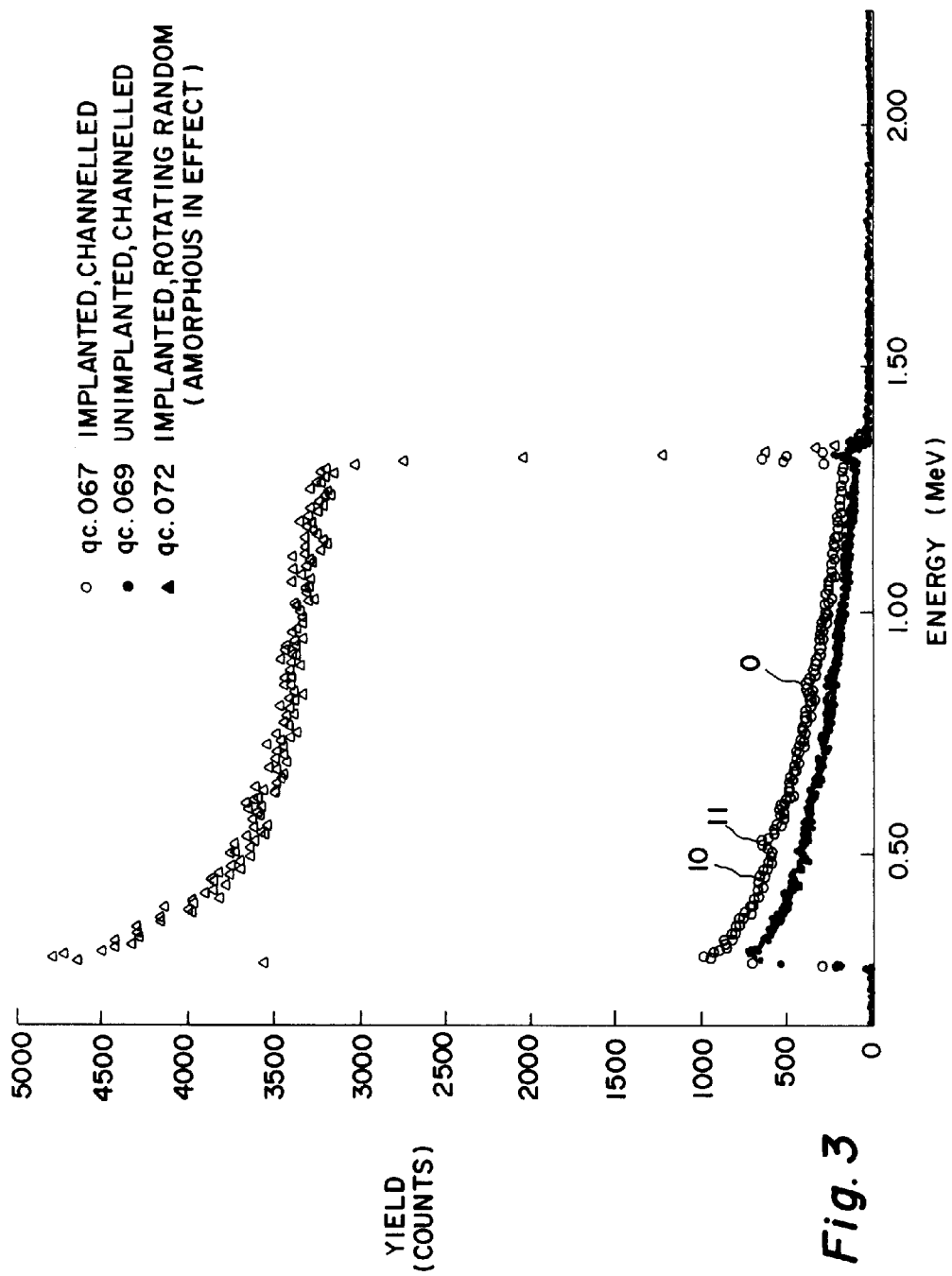
FIGS. 3 through 6 are graphs showing the plot of the yield versus energy.

FIG. 3 is the survey of Rutherford backscattering (RBS)/ion channeling results for the analysis, showing the implanted-channeled, unimplanted-channeled and the "rotating random" results. This high-energy helium ion backscattering and channeling is a standard technique for analysis of ion-implanted materials. Helium ion channeling for analysis (not implantation) is produced by alignment of a selected crystal axis to within about 1/100 of degree of the direction of the well-collimated incoming helium analysis beam. The rotating random result (qc.072) is in effect the same result as would have been obtained for polycrystalline or amorphous silicon. In the implanted-channeled (qc.067), there are small peaks for O, $^{11}$B and maybe a detectable $^{10}$B. Although these peaks are small, they are statistically unambiguous, and their locations on the energy axis are precisely at the energies expected for the scattering kinematics (2.3 MeV He incident ions and 160 degrees detector angle). We will proceed with analyses by amplifying the data. Note that channeling produces a huge reduction in background yield, as expected. This is the difference in yield between qc.072 and qc.067 in the range from the silicon edge at about 1.35 MeV and downward in energy. This reduction makes detection of a light element such as B or O much easier. For the rotating random curve (qc.072), stochastic aspects of the data increase greatly with the total signal, while the absolute magnitude of a peak such as that for $^{11}$B stays the same. Thus, even with smoothing, small peaks are less prominent on the ordinary RBS histogram (qc.072) than on the channeled (qc.067), even though the supposed B yield superposed on the rotating random background is the same as for the channeled. That is, if the component being detected in the channeled material is itself effectively amorphous (or random) in the single crystalline substrate. The following is a detailed analysis of these survey results.

Figure 4:
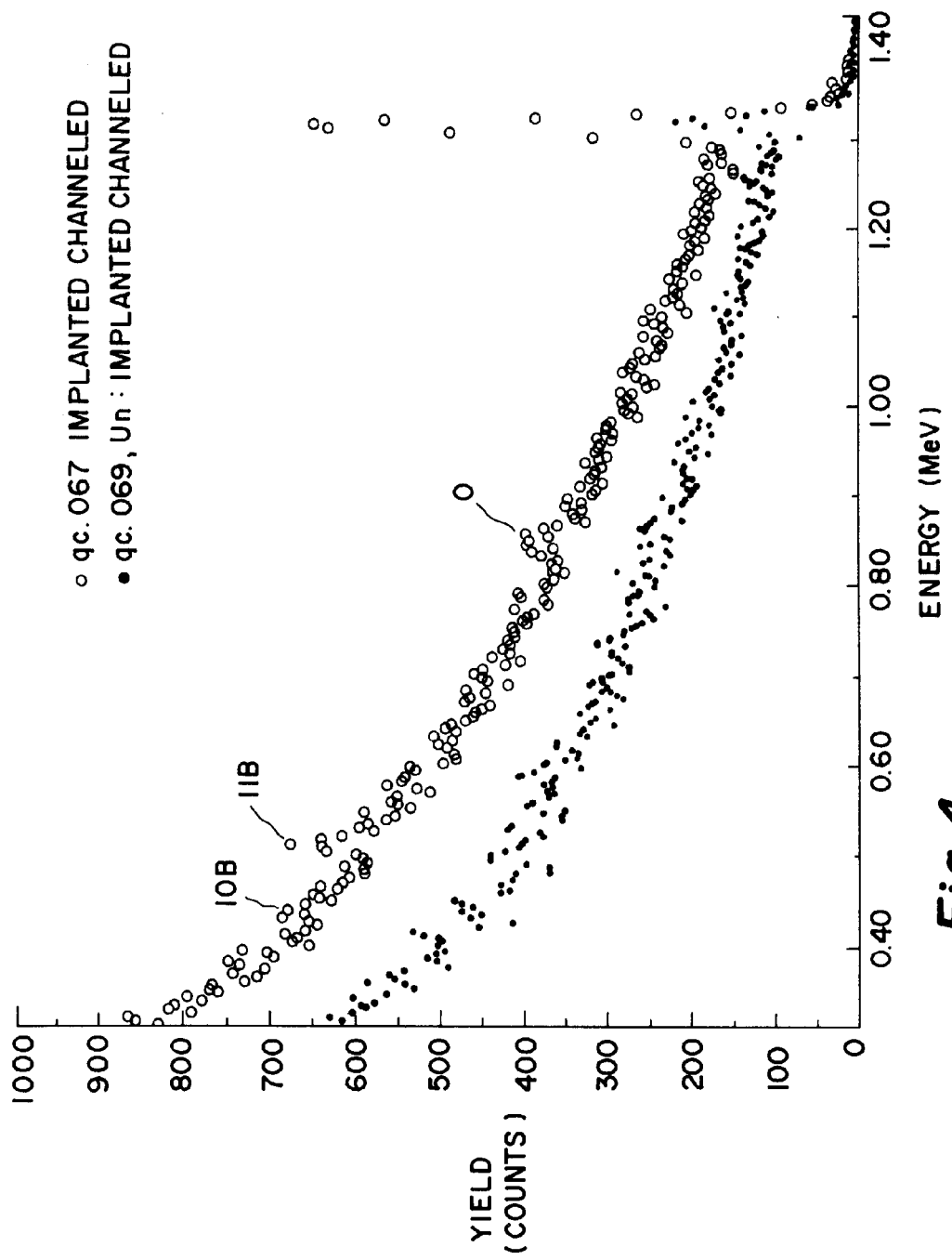
Figure 5:
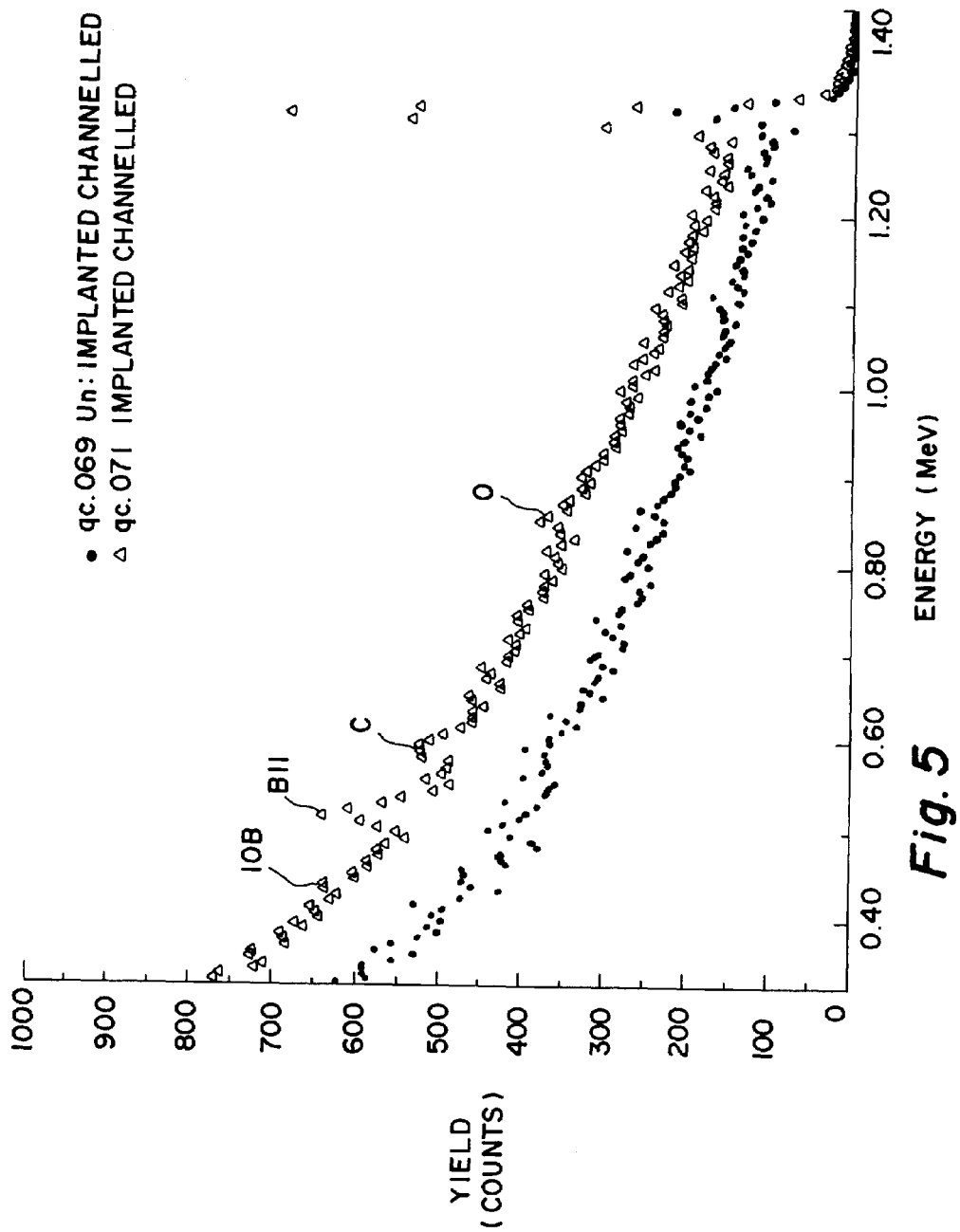

FIGS. 4 and 5 represent channeled curves only, with expanded Y-axes for 2 respective spots, qc.067 and qc.071, both in comparison with the same unimplanted/channeled, qc.069. The $_{11}$B peak is now more clearly visible in these graphs. The $^{10}$B peak should be about 20% of the $^{11}$B peak, but the $^{10}$B peak is difficult to resolve. FIG. 5 is the same as FIG. 4 in principle, but for another physical area on the sample.

There are several aspects to be analyzed, B concentration, O concentration, damage, amorphization, and relationship of these results to theory and to and native oxide.

The narrow spike in yield for the black curve (1.3 MeV in channeled unimplanted material, qc.069) is just due to backscattering from the first three or four layers of atoms in the single crystal of Si. This standard result, the so-called surface peak, involves scattering from more than one atomic layer, however, because of thermal vibrations. After a few layers, the possible vibration amplitudes of atoms below the surface have been fairly well shadowed by atomic vibrations in the first three or four layers, and the probability of scattering due to deeper atoms vibrating out into the crystal channel is greatly reduced. The larger spike at the surface for the implanted material (qc.069) is mostly due to damage, which is most likely amorphization of approximately a 100-angstrom layer of the silicon due to the implantation (detailed analysis below). The broad elevation in yield for the implanted material, after the surface effects, is due to partial dechanneling of the beam by the damage and the implanted ions together. The beam has more angular dispersion after passing through the damage, so channeling is not quite as effective in reducing backscattering from the energy of, say, 1.25 MeV on down to lower energies, as for the undamaged.

The two histograms for implanted material (qc.067 and qc.071) are fairly consistent as to surface damage peak, boron, and O, but there seems to be more carbon for qc.071 than for qc.067. That detail will be ignored for now, as we will not objectively treat carbon inclusion.

For the $^{11}$B peaks (see curves qc.067 and qc.071) stripping of the background yields counts of about 600 and 900 respectively, for an average net counts of 750 due to the boron. Now we assume that none of the boron itself is on lattice sites, so the boron itself is regarded as "amorphous" as far as backscattering is concerned. We believe this to be true, and that assumption will give a self-consistent picture. However, note that any incorporation of boron as substitutional atoms on (otherwise) Si crystal sites would only reduce the counts, relative to the above assumption. So what we derive from this analysis is the minimum boron concentration, in principle. The energy loss scale of FIG. 3 for the rotating random curve (qc.072) is readily converted to depth instead of energy. The boron concentration is calculated by appropriate ratio and proportion of known Si backscattering yield for known silicon atoms in a given depth (from the rotating random, qc.072), the boron yield of 750 counts and the known cross sections for Si and B (which ratio as the $Z^2$'s of the respective elements). The result is an area concentration of 4.5E16/cm$^2$ average for the $^{11}$B, and we have to assume 25% additional concentration for the $^{10}$B, for a total B concentration of 5.6E16/cm$^2$. This value is roughly equal (see below) to all of the Si atoms contained in the 100 angstroms of depth in the first place. Therefore, if the implantation depth is of the order of 100 angstroms (see below for justification) the average concentration in this depth may be already higher than 50/50boron, in effect. This conclusion will be confirmed by further analysis. Either that, or it might be argued that perhaps the B is not implanted, but is a thin coating. That is not the case, as further proof will be given later. Indeed, the whole point of this continuing analysis is to substantiate an implantation case, where results are what would be expected from the claimed process parameters (about 550 eV and 4E17/cm$^2$ impinging fluence).

A confirmation of the implanted boron value cited above was obtained by use of a nuclear reaction based technique. For $^{11}$B there is a (p,alpha) reaction for incident proton energies of 670 keV. Use of that reaction in conjunction with a standard sample that had been ion implanted to a known dose of $^{11}$B in a well calibrated high energy implanter yielded a retained dose of 6.7E16/cm$^2$ for the present sample, which is about 20% greater than the value from RBS derived above. This 20% difference is probably due to error in the RBS determination, rather than being due to some of the boron's occupancy of lattice sites, although we noted that RBS did, in principle, give the minimum concentration. That conclusion recognizes the somewhat weak statistical certainty of the direct RBS method for this light atomic constituent, in comparison with the high confidence level of the (p,alpha) technique. These data will be presented below in another context. Taken as whole, we regard the agreement to within 20% of the two methods as more striking than the disagreement, for present purposes.

In summary, despite some reason to weight the (p,alpha) results as more valid, we will take the total amount of B implanted to be 6.2E16/cm$^2$, which is the average of results from the two methods. This means RETAINED after implantation. Loss mechanisms, which account for the difference between this value and the approximate impinged dose of 3.5E17/cm$^2$, include backscattering and sputtering, and we will deal with these later.

Figure 6:
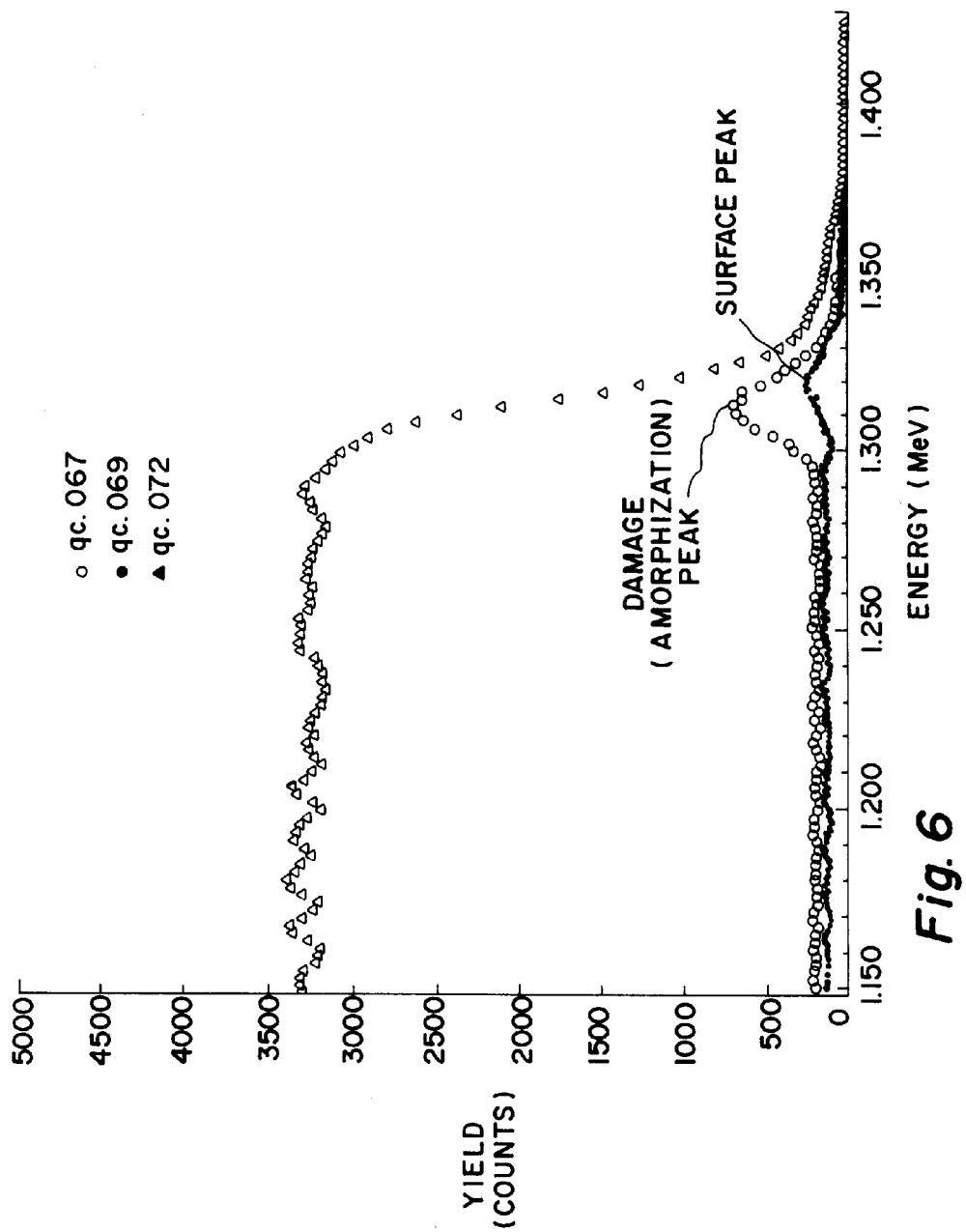
Figure 7:
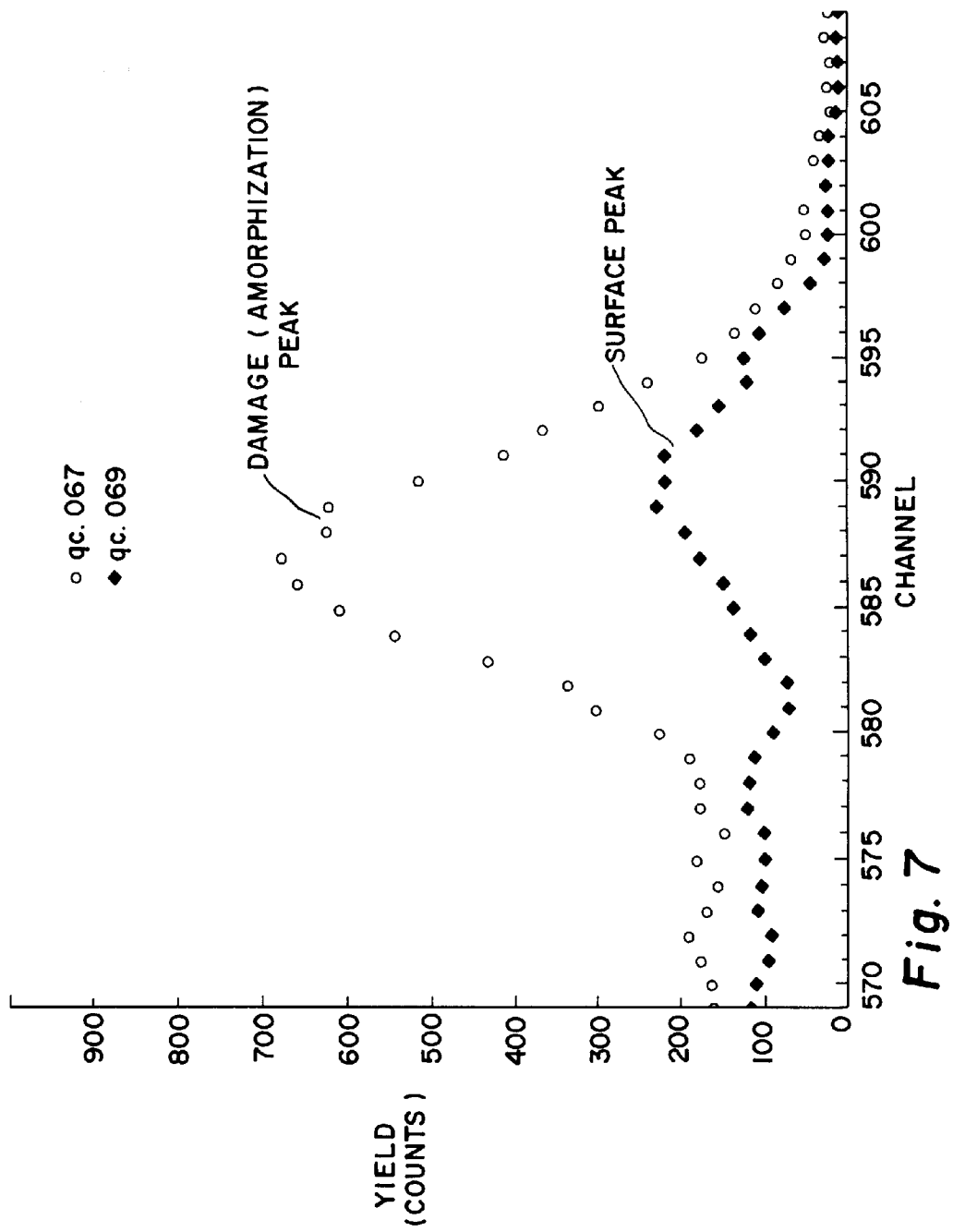
FIG. 7 is a graph showing the plot of the channel versus yield.

Referring now to FIGS. 6 and 7, we analyze some of the surface damage and oxide effects carefully. The total number of counts in the "surface peak" (1300 counts after stripping) for QC.069 (the unimplanted sample) is suggestive of just a few atom layers, say 5, or about 20 angstroms, being involved in that scattering. But the spectrometer spread is over a depth of at least 10 channels (FWHM of at least 6 channels. FIG. 7 expands the same data as shown in FIG. 6 but uses channels instead of the energy calibration.) The FWHM corresponds to at least 300 angstroms of depth in bulk material in inelastic energy loss, in comparison with the 20 angstrom value mentioned. That difference simply reflects spectrometer energy resolution. Integrated counts must be right, but counts are not necessarily in the correct energy bins. The total DAMAGE counts in qc.067 after stripping background is 5400, and the FWHM is somewhat greater for those counts than for the pure surface peak (qc.069). As a first approximation, we note that the 5400 integrated counts is approximately the same as would have been obtained from an amorphous silicon layer of 80 angstroms. That value is derived from the rotating random depth plot. (It is not proper to subtract off the surface peak of the channeled spectrum, qc.069, to get "net damage" because the first 3 or 4 layers "do not know" whether they are amorphous or not. Scattering from these layers is about the same whether within an amorphous or crystalline state.) Thus, we strongly suspect that an 80 angstrom layer of amorphous silicon or a layer of amorphous B—Si alloy would probably produce the same spectrum as qc.067. The hypothetical effective thickness of amorphous silicon is determined in the first approximation by the total counts (5400) and up until this point in the argument, it is intuition based on experience, that the damage peak (in FIG. 5, qc.067), spread out over some channels, is due to an amorphous layer, rather than just damage within the crystalline state.

Figure 8:
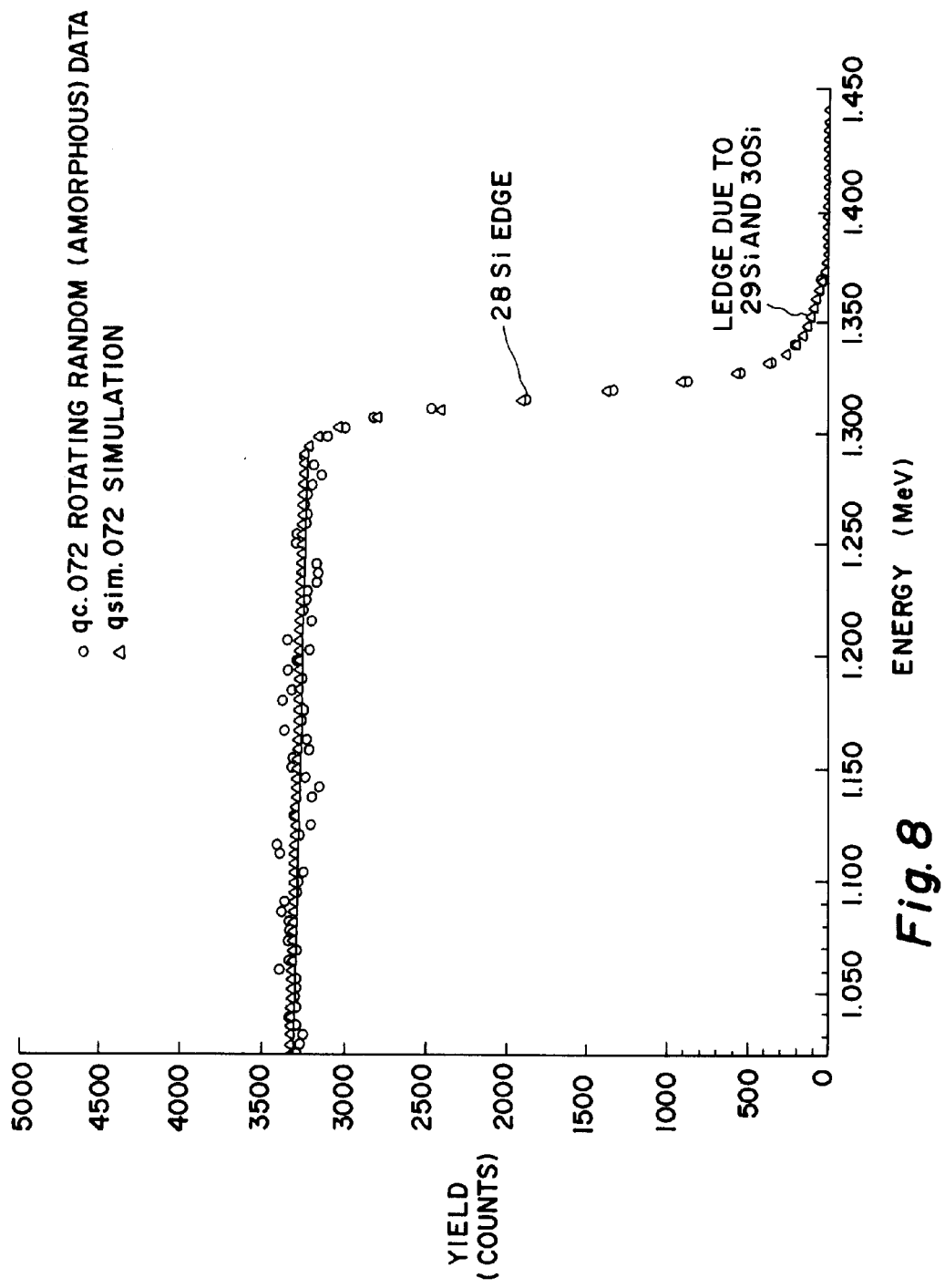
FIGS. 8 and 9 are graphs showing the plot of the yield versus energy for versions of the invention.
Figure 9:
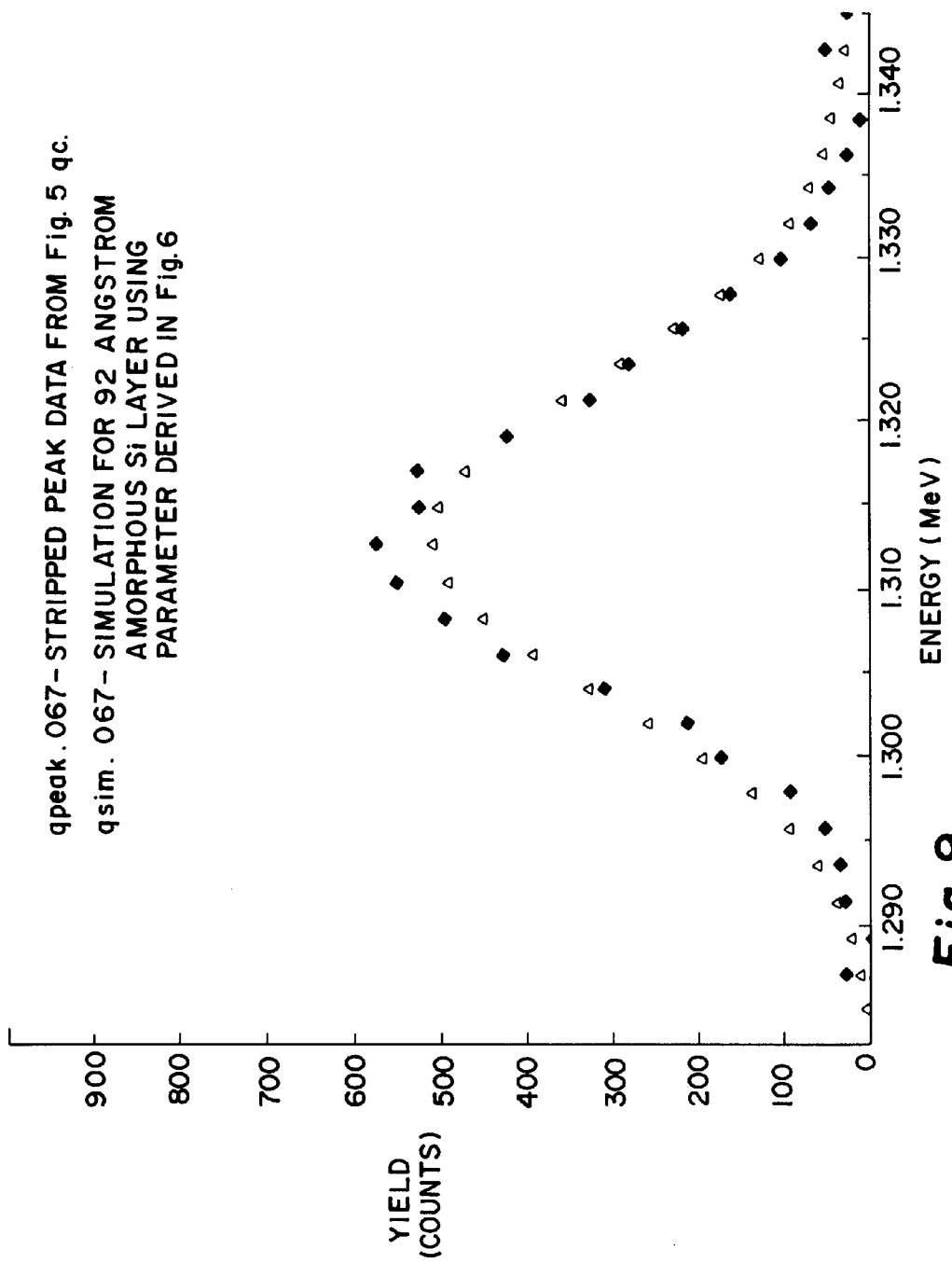

That conclusion will now be supported more formally, however, by simulation. Simulation parameters, most importantly the spectrometer resolution, were determined by simulating the solid "amorphous" silicon, or rotating random case (FIG. 8, qc.072). The charge of 60 microcoulombs of helium ions is the normalized value of what was actually used experimentally. The detector acceptance solid angle was then used to fit the absolute yield on the plateau. The value obtained was geometrically realistic. The spectrometer resolution was then chosen to fit the spread of the leading edge, that being from 1.30 to about 1.34 MeV for $^{28}$Si. The form of the edge should ideally be an error function due to spectrometer resolution, but in terms of physical ideality in atomic elastic scattering theory, practically a sharp step function. (Also scattering due to $^{29}$Si and $^{30}$Si is detected above 1.34 MeV, and produces some asymmetry relative to the error function, but is included in the simulation). This simulation for the silicon standard amounts to a full calibration of the spectrometer with respect to both ENERGY and YIELD axes. Then, as depicted in FIG. 9, we have used the same simulation parameters that fitted the data of FIG. 8, to calculate the peak that would result from an amorphous layer of 92 angstroms thick of Si. That has been compared with the "background stripped" peak of the data (qc.067, data also shown in FIG. 7). As stated, the 92 angstroms depth was chosen to make the integrated counts in the two peaks about the same, whereas 80 angstroms was the value estimated above. The point we wish to make here is that the spread of the simulation is about the same as that of the data. Further simulations indicated that this amorphous peak result is also not likely to depend on boron or oxygen concentrations in the affected layer, within any limits we expect in the present experiments. Modeling was done for up to 75 at. % boron in the layer, for example.

Fitting of data by a model does not strictly prove the model, but in conjunction with the whole and continuing case, no other explanation seems likely. As a further confirmation of amorphization, the silicon exhibited the same color change that is commonly known to occur upon amorphization due to ion implantation. This color change is also known to accompany shallow junction implantations.

Thus, amorphization to approximately the depth stated is supported except for one detail. The amount of Si contained in the oxide has not yet been factored out. Referring again to FIGS. 4 and 5, it will be noted that some oxygen is present, with the ion implantation process having possibly played some role in helping to add the oxygen (the mechanism will be discussed below). That conclusion results from the relative absence of an oxygen peak on the unimplanted area (qc.069), although it is certain that some native oxide is present. The average net oxygen counts for the two runs was 320 counts. As far as backscattering is concerned, Si contained in amorphous oxide will not be distinguishable from other "random" silicon, which might be contained in a layer amorphized due to radiation damage from implant. Based on the stoichiometry of SiO$_2$ and the cross section difference between Si and O, which go as the respective Z-squared values, the number of Si counts for Si in oxide should be 1.53× the oxygen counts, or about 490 counts. Thus, the estimate of amorphous silicon depth (in the silicon itself) should be reduced by about 9%, (490/5400) or from 92 to 84 angstroms, due to taking into account Si atoms in the oxide.

This result is still important because it proves that we have implanted, damaged and amorphized actual silicon in the substrate, rather than simply having treated the surface oxide. However, even though the effect of the oxide correction is to reduce the estimate of the amorphous elemental silicon layer thickness by only 9%, that does not mean that the boron inventory in the oxide and the amorphous layer are proportionally distributed. That is partly because the expected profile of the boron is somewhat bell shaped in the first order, but also skewed backward toward the surface due to backscattering and sputtering during implantation, and also due to possible chemical segregation in the oxide (see below). To determine the fraction of boron in the substrate versus the oxide, the following etching experiment was performed. It is well known that a hydrofluoric acid (HF) solution of about 10% concentration of the standard 50% commercial preparation, preferentially etches oxide from silicon without attacking the silicon. A portion of the wafer was etched in this fashion and that area was further analyzed by use of both the RBS and the (p,alpha) reaction for comparison with results from the unetched area.

Figure 10:
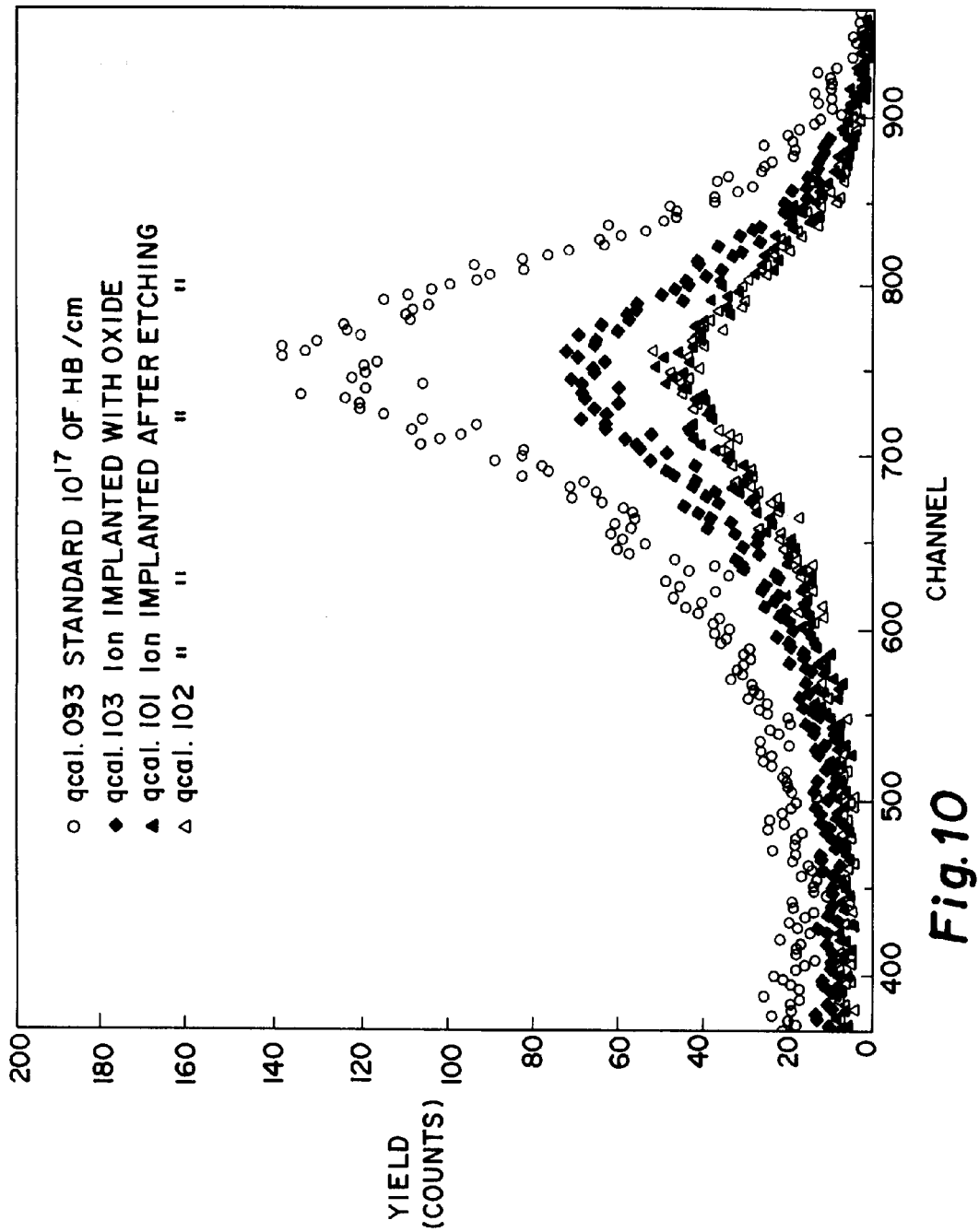
FIG. 10 is a graph showing the plot of the yield versus channel.

FIG. 10 shows results of the (p,alpha) analysis for the standard sample ($1E17/cm^2$ of $^{11}B$) in comparison with a run for the as-implanted sample and two runs for the implanted/etched. Yield results are plotted versus channel instead of energy, and the alpha particle yield for the reaction is spread out in the broad peak ranging from about 550 to 950 channels. Boron contents are in principle proportional to the areas, or integrated counts in the respective peaks, except that an upward adjustment of 25% in total boron content must be made for the unknowns because natural boron is 20% $^{10}B$ and the standard is 100% $^{11}B$, with that isotope having been selected by mass spectroscopy as part of the implant process (the magnetic separation process used in normal ion implantations provides for isotopic separation). Results for the present implanted sample (before etching) were given above, as $6.6E16/cm^2$ of concentration. Results of FIG. 8 indicate that etching carries away ⅓ of the boron with the oxide, so that the boron retained in the silicon was $4.5E16/cm^2$ after etching. RBS/ion channeling data for the etched sample indicated that the oxygen peak was greatly reduced, which is to say, similar to the result from say qc.069 (FIG. 4). This means that the etching provided considerable separation of the oxygen from the implanted boron, and would indicate that the oxygen was not also implanted, but was oxide formed on the surface.

Next, we will analyze sputtering, backscattering, amorphization and retained boron doses with the aid of theory and calculational techniques commonly used in ion implantation applications, as manifested in the codes TRIM [11] and PROFILE [12]. These arguments will be somewhat circular and iterative. In the end, the main point is that there are no detectable incompatibilities with our argument, but certain advantages to the present implantation technique will be revealed. First we will consider, and largely dismiss, direct backscattering of boron as a factor in determining the concentration. Since the target atoms, Si and O, are heavier than the incident ion (boron) and the surface is near for the shallow implantation, there is a certain probability that direct elastic backscattering of the boron will occur, with escape of the implanted constituent outside the surface. TRIM is the more accurate of the two calculations mentioned above regarding this effect, but in either case the effect is rather small, 6% or less. Thus the possible effect of backscattering in accounting for the difference between our retained dose ($6.2E16/cm2$) and the maximum possible impinged fluence, mentioned above, is not very great, being less than 6% of the impinged fluence.

Figure 11:
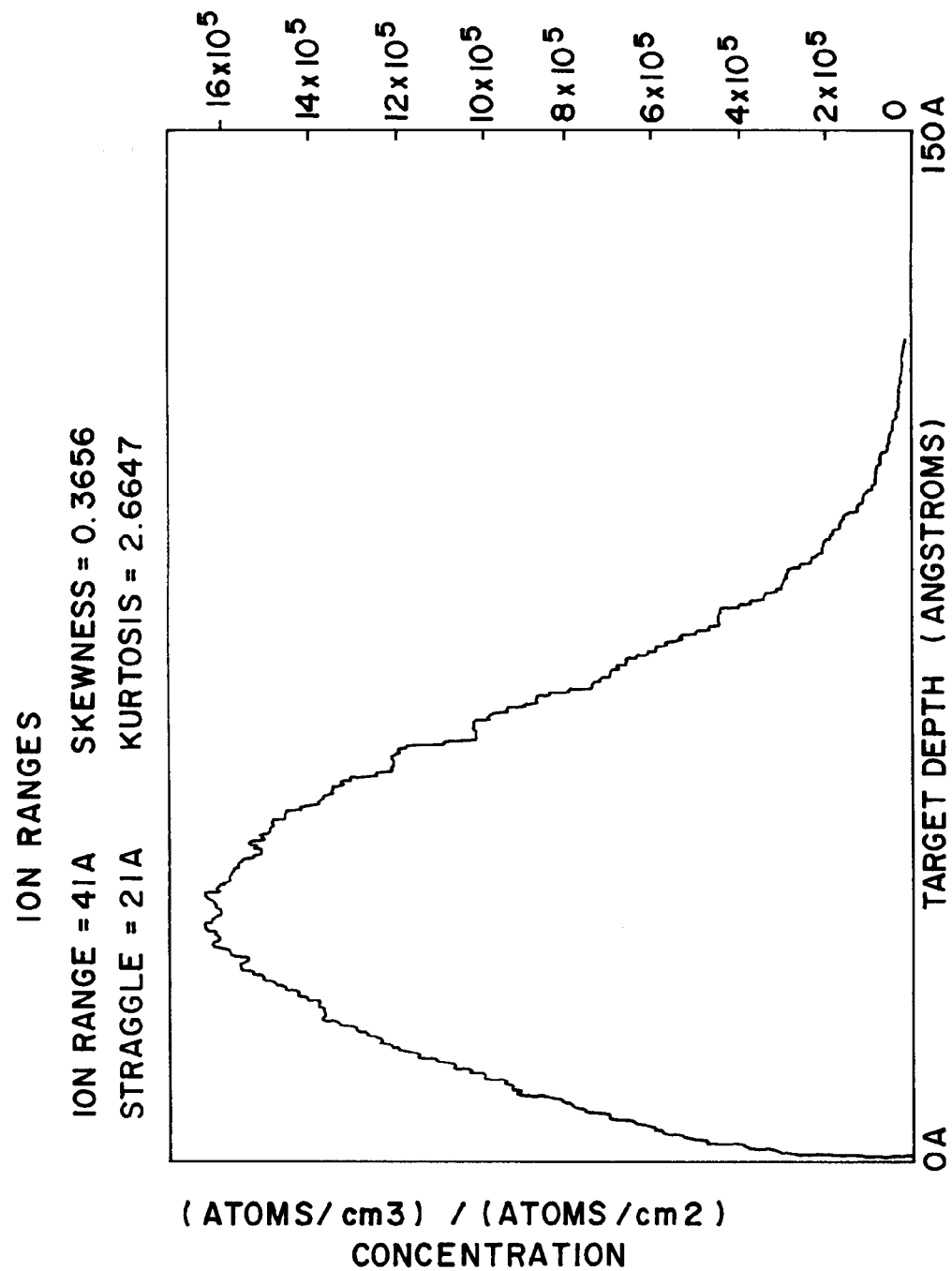
FIG. 11 is a graph showing the plot of the target depth in angstroms versus concentration.
Figure 12:
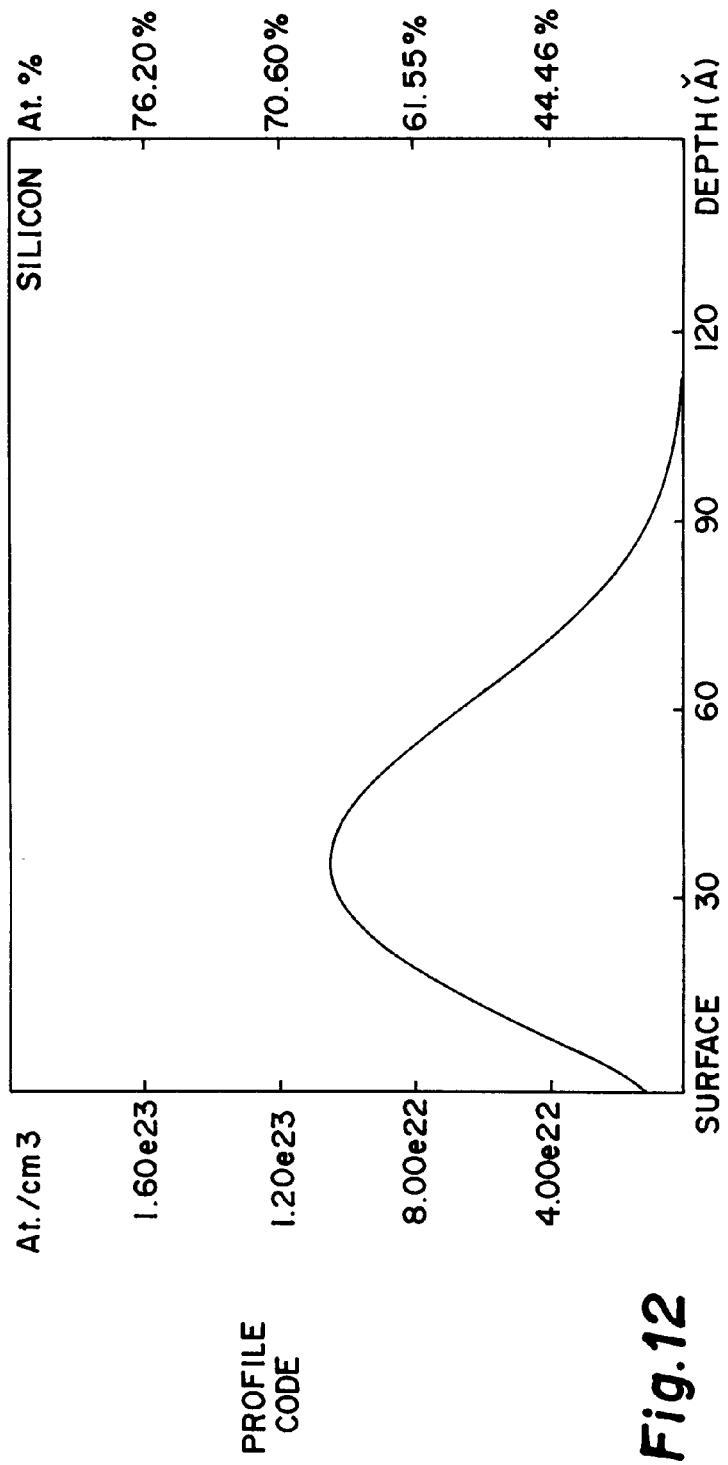
FIGS. 12 and 13 are graphs showing the profile code of silicone being treated.

Now, referring again to FIGS. 4 or 5, these data suggest that part of the oxygen was deposited as part of the implantation process. At the same time, it is difficult to imagine that there was not some oxide already there, even though an oxygen peak was not well detected for the unimplanted material. Thus, we do not necessarily yet ascertain the combined dynamics of deposition and sputtering of the oxide, but proceed with analysis, from which a proposed timeline of events emerges and which is presented below. To approach the question, one asks how the oxide might affect the retention of boron due to sputtering. To illustrate first how sputtering, in general, affects retention, we show calculations for sputtering and no sputtering. First, FIG. 11 simply shows a TRIM range calculation for 550 eV B into plain Si, with no oxide on the surface. The code calculates the sputtering coefficient, but does not invoke it, in the sense of estimating the effect of sputtering on "eating into" the previously implanted material. That function is for another program code, called PROFILE® [12], which works the moving boundary problem produced by sputtering. But initially, from FIG. 11, we see mainly that at least the implant affected depth of about 100 angstroms is broadly in agreement with what is derived from the RBS analysis for the depth of amorphization. That point will be discussed again later. The TRIM plot (FIG. 11) is for 100,000 statistical ions in a Monte Carlo calculation, but not for a "real" dose. To simulate a real situation, we have put the range parameters calculated by TRIM into PROFILE for a supposed real incident dose of 6E16/cm2, but specified NO sputtering (remembering that our supposed incident real dose was $3.5E17/cm^2$). The result is in FIG. 12, where the curve should and does have about the same form as in FIG. 11.

Figure 13:
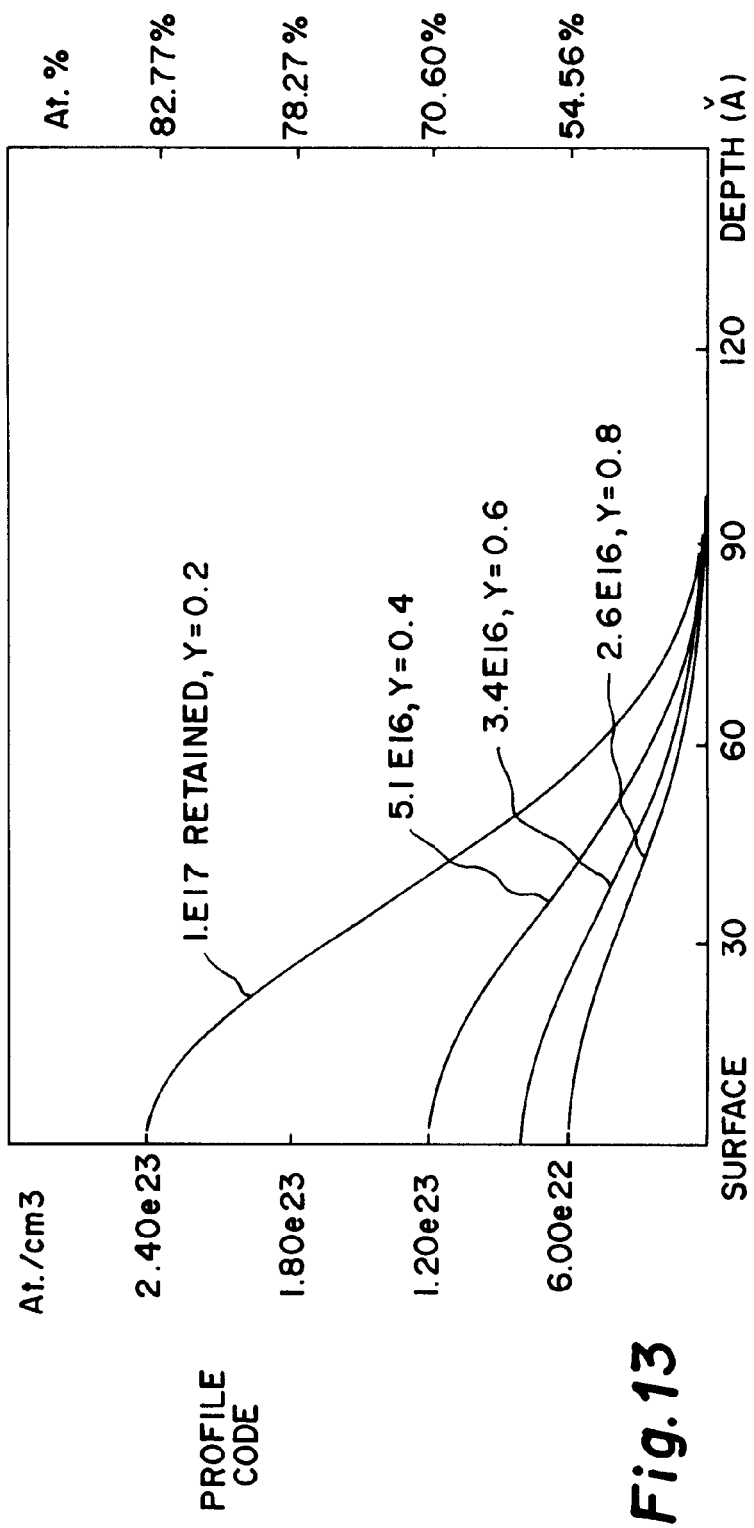

Now we consider the (potential and hypothetical) effect of sputtering. Sputtering introduces a moving boundary into the problem, such that as the surface erodes away, ions are implanted into material at depths that were previously out of range, while material that was previously implanted moves incrementally toward the surface, and, may itself finally get eroded away. For increasing applied doses, the result eventually reaches a steady state, for which the maximum concentration is at the surface, and the value of the concentration is a coefficient multiplied by 1/Y, where Y is the sputtering yield. FIG. 13 illustrates that case of saturation for 4 sputtering coefficient values as parameters, where an incident impinged fluence of $4E17/cm^2$ (which was approximately our experimental value) has been chosen. That dose is high enough to produce saturation for even rather low sputtering yields. Generally the minimum real applied dose necessary to produce saturation for a given sputtering yield is about a factor of 2 greater than whatever the saturation retained dose, itself, turns out to be for that yield. In any case, FIG. 13 illustrates the principle. The volume concentration at the surface is inversely proportional to the sputtering coefficient, Y, and thus the retained dose ($\#/cm^2$) is also approximately inversely proportional to Y, since the curves all have somewhat the same normalized form with respect to the depth variable. By use of the data of FIG. 13, one can "back out" what the applicable sputtering coefficient was for our experiment, without necessarily knowing whether the surface was oxide or bare Si during the implantation. That is done by plotting the maximum retained dose versus sputtering coefficient, and then interpolating for our actual retained dose. That is done because the quantity we know with the most accuracy is our retained dose, rather than the impinged dose. The result is that the sputtering coefficient that applied during our implantation was 0.33 for the retained dose of 6.2E16/cm². That assumes that we reached saturation, which is probable. If we did not reach saturation, the sputtering coefficient is even less.

Thus, it is inferred that the prevailing value of the sputter coefficient during the "determining" part of our implantation was 0.33. Now, the TRIM-calculated value of the sputtering coefficient for bare silicon is 0.5, and that for Si with a 10 or 15 angstrom oxide layer is 0.8. This latter value is hardly dependent on oxide layer thickness; the value for solid oxide is the same as that for Si with the oxide layer. Our inferred value is lower than either calculation, but much closer to that of bare silicon than to the value expected for the oxidized silicon, although the Si was surely oxidized by the time of the analysis.

These observations, together with the etching results, point the way to the following hypothesis as to the sequencing of events during our implantation. First, we note that the equilibrium vapor pressure of oxygen over $SiO_2$ is some 1E-150 atmospheres at the processing temperature. Therefore oxidation and re-oxidation of silicon surfaces in nominal industrial and laboratory vacua is determined by kinetic impingement rates, as might be calculated from kinetic theory of gases, rather than by any realistic thermodynamic equilibrium interaction with the residual atmosphere. A common rule of thumb, derived from kinetic theory, is that an atomic layer of gas impinges in one second at a residual pressure of 1E-9 atmospheres at room temperature. For our process it appears that the high intensity plasma plume arrives with the high atomic velocity characteristic of the plasma atom energy (40 eV), and then is accelerated through the plasma sheath surrounding the sample by another 500 eV. The vacuum may or may not be somewhat spoiled by the plasma in transit as it impinges on chamber parts, so the instantaneous pressure may not be well known. Nevertheless, the boron is implanted at the equivalent impingement rate of 100 or more atomic layers/sec. The net effect of this huge implantation rate is to remove oxide by sputtering much faster than the oxide can reform in that vacuum. After a moderate fraction of the total dose, the oxide has been removed and the surface stays clean, whereas much of the oxide would have reformed as fast as it was sputtered at lower dose rates typical of most implantations. Thus, the "bare silicon" sputtering value might obtain in the process, to first order. Yet there is another, and perhaps even fortuitous, aspect to the obtained sputter yield of 0.33. Boron concentration is building up during the implant. The calculated sputter yield for Si was 0.5, as a stated. However, calculation of the sputter yield for 50/50B/Si yields a value 0.37, and the value for 75/25B/Si is 0.30. We note from FIG. 13 that rather high concentrations are building up toward the end of the process. Thus it appears possible that the ability to incorporate B is somewhat autocatalytic after the oxide is sputtered off. The more boron one puts in, the lower the sputter coefficient and more boron can be retained. Regardless of agreement with theory, however, the relative certainty in accuracy of retained dose means that the experimentally derived sputter coefficient of 0.33 cannot be greatly in error. In summary, the inferred concentration of 75/25-B/Si is compatible with the sputtering yield of 0.33 and vice-versa. There is a convergence.

After the implantation is complete (order of 1 second/pulse) the "protective" oxide reforms in some seconds. As to the 33% of the boron removed with the oxide upon etching, accounting for that result is uncertain in exactitude, but results are compatible with reasonable ideas. From the RBS counts due to scattering from the O, we had calculated (above) that the related number of Si atoms in the form of $SiO_2$ would be 4E15/cm² (corresponding to 8 angstroms of elemental silicon, in effect). If, as indicated by the sputtering calculation (FIG. 13), there were in the same thickness area three times as many boron atoms as Si, the amount of B removed would be 19% of the total. Again, however, there is potentially rather high error in the oxygen determination because of the smallness of the peak (FIGS. 4, 5). Any other boron removed (up to the 33% level) must have been redistributed towards the surface due to some combination of implant heating and supersaturation before the oxide formed, or preferentially redistributed into the oxide after it formed. Such effects are not unknown at higher temperatures, and processing temperature may be a factor in that result (see below).

The important point is that even after the etching process, the retained dose is over 4E16/cm², which is still a factor of two more than can be retained by competing processes where the sample has not even been etched yet [10]. The sputtering coefficient necessary to fit FIG. 5b of the cited reference is 1, which is more in line with the expected value for oxide. Therefore the maximum retained dose would be about 2E16/cm2, even without etching, for the results of this reference [10]. We note again that in our model, the boron removed by etching was presumed to be, at one time, in clean silicon, and better vacuum practice might be able to restrict the thickness of the new oxide layer formed after implantation.

This comprehensive and self-consistent analysis gives confidence that our experiment has treated silicon to the expected depth and with the expected retained dose, and has also produced amorphization. It is nevertheless appropriate to comment upon limits of these calculations as compared with experimental results, particularly for this case of shallow doping. It was noted that, if one had retained some 6E16/cm² of B into the implant layer, the concentration of B would then be about 75 at. %. This shallow junction analysis will differ from typical analyses of higher energy implants because the effects of "crowding in" of the boron and the effects of displacement damage will be less separable from each other in this small space. In the higher energy analyses, the damage profile (also calculable by TRIM) is always peaked at smaller depths than the concentration profiles by amounts such that certain effects can be resolved. If amorphization occurs it is invariably due to damage in these normal implants. Another difference in the present case is that because of the intensity of the implant current, there is the possibility of higher heating rates than would accompany a conventional implantation. That means that the present implantation perhaps amounts to a combination implantation and anneal. Therefore, for the present case, the boron, by its mere presence at very high concentrations may cause the appearance of amorphization by one or more "constitutional" amorphization effects that are possible. One might be lattice distortion due to the shear concentration of B atoms in a metastable supersaturated situation. Another might be formation of the $SiB_3$ compound [13] (originally reported as $SiB_4$ but later amended to $SiB_3$, T. E. Haynes, author, private communication). The compound gives the appearance of amorphization. Our apparent concentration is in the ideal range for such a compound, and the heat favors formation. At the same time, the damage alone might also have produced amorphization, particularly at these high damage rates. High heat rate would not favor amorphization by damage, but high damage rates would. For these low energies, the form of the damage profile (TRIM result not shown) resembles that of the ion range profile. The damage profile also has its own "moving boundary" aspect, as was described for the range profile. Thus, for the end-of-range effects analyzed in the present case, and for near the finish of the implantation, the retained damage is closely related to the retained dose. It can often be assumed that silicon is amorphized at room temperature by a damage level of about 0.2 displacements per atom. If that assumption is made for the present case and for our retained boron dose, comparison with a TRIM calculation reveals that the amorphization depth would be 88 angstroms due to the damage alone. This value, again, is in good agreement with what we have been arriving at by other calculations and analyses. Thus, for our doses and implant energies, we do not assert whether the constitutional or the damage effect was the more important in producing amorphization. The real question is, "Which of the two possible mechanisms worked first, or were they synergistic?"

It is clear that the affected depth and incorporation of boron are fairly precisely what would ideally be expected for the claimed parameters. The amount of incorporated boron, without annealing (or only implant annealing) is very high. Subject to qualification and further study, ways in which the processing characteristics for this implantation method can produce fundamental benefits include, but are not limited to:

Early self-amorphization by the boron implant itself, rather than having amorphization occur by pre-irradiation with an otherwise unneeded and potentially harmful constituent [14]. Amorphization helps prevent broadening of the junction by channeling of the implanted constituent.

Suggested "total removal" of the "protective" oxide for the short duration of the implant means that diffusing interstitial atoms can be "sunk" at the surface rather than being reflected in and contributing to broadening of the junction by oxide enhanced diffusion [15]. Oxide prevents the surface from acting as a sink for diffusing point defects. An oxide quickly reforms after the implantation. Because of the high implant rate, short exposure time, and excellent vacuum possible, no contamination occurs while the silicon is bare.

Very high rate of damage produces more recombination of defects (a second order effect) and thus limits enhanced diffusion and broadening of the junction. These high-rate effects, in principle, simulate the effects of cryogenic implantation [16], in not allowing time for thermally activated processes to take place during the implantation, provided there is enough cooling to offset the high heat rate. If heat due to the high treatment rate cannot be managed, then the process can still utilize high instantaneous rates, but with shorter pulses to allow interim cooling.

Regardless of mechanism of profile spreading or the mechanisms that determine time dependency, the short times required will help avoid profile tailing, unless offset by high temperatures.

Probable highest incorporation of boron of any other technique may enable higher metastable dissolvable boron and thus lower sheet resistance, as needed for shallow junction doping. Sheet resistance of this sample was quite low, especially for an effective depth of only 100 angstroms (approximately).

Although the above is a demonstration for a shallow junction implantation, use of the ion source for ordinary-energy (keV) types of implantation is also perfectly viable. There is no intent to abdicate the energy range of keV implants for our technique by use of a shallow junction case as the first demonstration.

Experience in production of mechanical coatings by cathodic arc techniques might at first give rise to a pessimistic view regarding prospects for processing semiconductors with satisfactory MP filtration. However, there are some intrinsic advantages worth noting for the semiconductor application. One is the extremely small ion doses often needed for semiconductors as compared with coatings. Another is the very high value of the product, in comparison with that of coatings, and the costly nature of the competitive process already used for atomic filtering. This means that a rather expensive MP filter can be used, if needed, and more ion flux can be sacrificed for filtering if needed, while still maintaining cost competitiveness. Still another advantage lies in the higher energy often used in semiconductor implantations (high negative acceleration voltages of up to 20 kV) for regular implantations, as opposed to "shallow junction" doping. The acceleration voltage may be applied either at the termination of the process (plasma immersion) or beginning (beam extraction), but in any case can be used to repress a large fraction of the MP's by more than one strategy. Moreover, MP's can be reduced by other techniques of firing the cathode, which have not yet been introduced in our experiments. Designs described below will include various methods.

To illustrate the low-dose advantage, the MP concentration was $1400/cm^2$ for the above-described implantation. This MP concentration value is obviously much higher than would be acceptable in any solid-state device application, although the fractional occluded area was still only about 0.001. However, the applied B dose was $3.5 \times 10^{17}/cm^2$, or nearly 1000 times more than might be needed for doping in many device applications. Therefore, if we extrapolate to the idea that the plume was expanded to 1000 times the area, or the fluence were 1000× less for practical results, and the MP concentration were proportional, then the MP concentration borders on being acceptable already at about $2/cm^2$. There may have been other evidence of particle damage, however. While our development proceeds with the idea that good particle filtration is needed, this moderate value with such a modest filter gives reason to hope that the problem is quite tractable.

The advantage from direct electrostatics is illustrated as follows. Suppose one contemplates only a 10 keV "ordinary energy" implantation, which is very modest in energy for the normal doping (as opposed to shallow junction). Over our transport distance of 60 cm, equilibrium charging of MP's is sure to occur [17]. Then from the implant data above, one can estimate the plasma density, and thence the Debye length and plasma sheath thickness around the MP's. Borrowing from the methods of reference 17, one can calculate the capacitance versus MP size for concentric spheres of the MP radius and sheath radius. Estimating the sheath voltage, one can then calculate the MP charging. In broad agreement with the reference [17], charges turned out to be 4.5E-15 coulombs for 1-micron diameter MP's and about 10 times that for 20-micron MP's for our case. From the boron mass density, then, follows the energy and velocity of particles for complete stopping by given repulsive voltages. For the 10-kV value cited, all particles of 1 micron in diameter with velocities less than 280 m/s will be repelled. This value undoubtedly represents perfect filtering for MP's of that size or less. On the other hand, for a particle as large as 20 microns in diameter, of which there are some, the maximum velocity for direct repulsion would be only 10 m/s. That is probably not good enough. As will be seen in the designs below, however, 180-degree repulsion is not necessarily needed—only enough lateral steering to separate the MP's directionally from the ions. Thus, moderate acceleration still turns out to be an advantage.

Note on Boron Carbide or Other Composition Cathodes.

For the experiments described above, a great effort has gone into development of a cathode of rather pure boron. Before that, the inventors had developed a proprietorship of interest in boron carbide ($B_4C$) cathodes and in deposition of coatings by use of the cathodes. From the standpoint of execution, the boron carbide cathode system is more mature in some ways than that of the pure B, both with respect to cathode synthesis and with respect to process execution. There is literature on possible effects of incorporating carbon into Si. One factor is that C is 4-valent as is Si, and is therefore electrically neutral if incorporated into the lattice. If it were to turn out that the carbon is acceptable or beneficial, we of course claim dominion over the obvious extensions of our idea, such as boron carbide, or boron-carbon at other compositions. Even other compositions, such as the boron-silicon compound, could be used, and except for the development of the cathode itself, the application to the present task of doping is a clear extension of the present pioneering effort.

K. System Concepts and Designs.

The characteristics of the vacuum arc ion source open the door to a host of creative possibilities and combinations, as far as system designs are concerned. The present section identifies a few. As was stated, there are two fundamentally different approaches to extraction of positive ions from plasmas for ion implantation. One is the "beam" approach, the most commonly used one at present. Ions are extracted from the plasma and a positive ion beam is formed and directed to the target. A certain amount of "conditioning and management" of the beam may be required in the process. Plasma electrons are rejected from the beam and back into the plasma at the point of extraction. Some, so-called "tramp" electrons may then join the beam during transit as a result of interaction with residual vacuum atoms. The target is not an electrode in the process; the ions are in free flight like bullets having been shot from a gun when they strike the target.

The second approach is that of "plasma immersion implantation" (PII). The target is an electrode. The target is surrounded with plasma. Upon biasing of the target, ions are extracted directly from the plasma to the target.

Each technique has advantages and disadvantages, which will not be discussed in detail. If atomic separation is needed because of chemical content of the plasma, then the beam technique is the only viable one. That is why it is the one most used at present. The PII technique is generally intrinsically cheaper and simpler where it can be used. It is also easier to adapt for normal entry into large areas (e.g. 30-cm wafers)

Plasma generation by our technique may favor PII in some ways because of the atomic and ionic purity, as well as the robustness of the plasma. However, MP's still have to be filtered. In what follows are designs for systems utilizing either technique. These designs illustrate concepts. These concepts and designs are not necessarily unique solutions to the problem. They can be hybridized or mixed and matched in several ways.

K1: A Beam Concept With Electrostatic MP Filtering.

Figure 14:
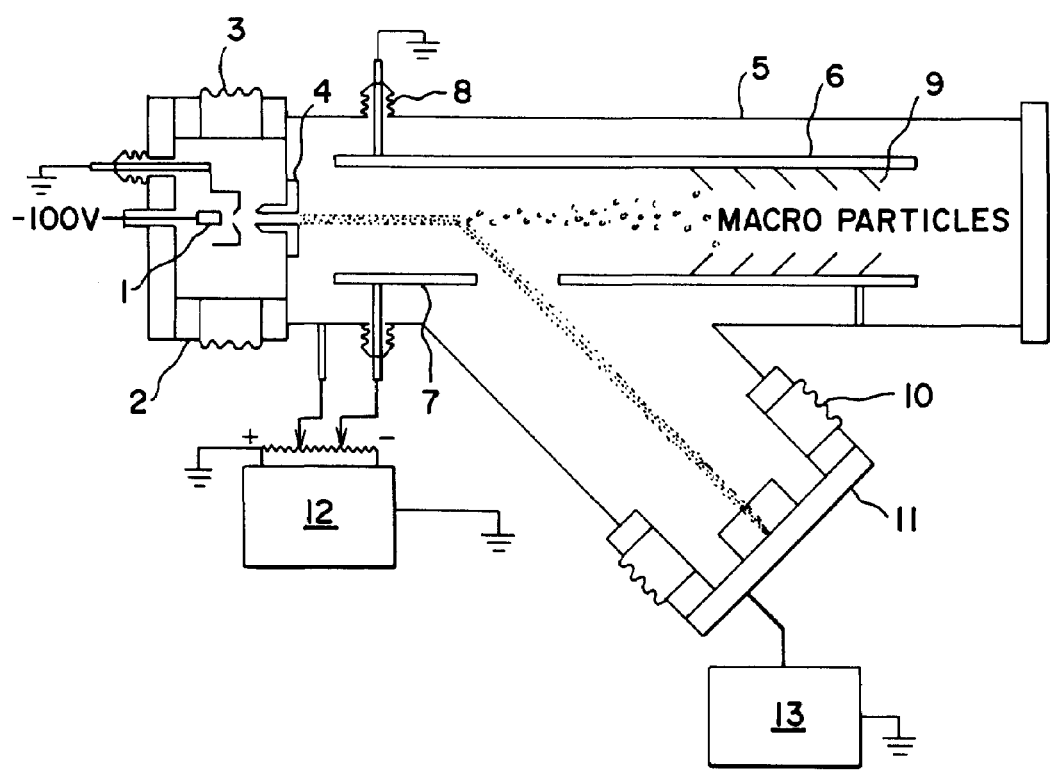
FIG. 14 shows a subassemnbly of the equipment forming the invention.

FIG. 14 illustrates the concept. There follows a list of the numbered components, with a short description of their functions, where not obvious.

PROCESSOR COMPONENTS AND NOTES

1. Boron cathode
2. Anode/arc chamber with anode extraction aperture—biased to about 100 V for arc.
3. High voltage insulator for accelerator side—to 40 kV rating-composition vacuum coupling of the type used in ion implanters.
4. Extraction electrode on high voltage side with extraction aperture of desired shape—Some tens of kV extraction voltage.
5. Bending chamber (a vacuum chamber). Entire chamber is at high voltage (negative relative the source assembly, 2) except for the grounded bending plate.
6. Grounded bending plate.
7. High voltage bending plate. Voltage closely coupled to chamber voltage, depending on plate geometry.
8. High voltage feedthrough for grounded plate. Feeds through vacuum wall.
9. Baffling/trapping design for macroparticles.
10. High voltage insulator for target assembly—similar to 3, but not used for all situations.
11. Target subassembly. As depicted in the drawing, this subassembly representation is highly symbolic. The detailed design includes wafer manipulation, as needed and cooling as needed. There may be several chamber designs.
12. High voltage power supply for ion acceleration and plate steering.
13. Target energy management power supplies as needed, depending on manifestation.

Note: At this point the issues of grounding, as far as absolute grounding and ground cages for personnel safety are concerned, are not dealt with in the description. Grounds indicated are relative.

Operation

This embodiment employs a beam extraction concept, which may be similar in many ways to the classical Freeman extraction concept, except that instead of having the plasma generated by a Freeman ion source, the plasma generator is the cathodic arc source. Aside from that difference, other aspects may be similar and some may be different. The need for the so-called "accel/decel" arrangement of the Freeman source for prevention of X-rays from back-accelerated electrons is not clear yet. In addition, the aperture shape for the present design will not have anything to do with the classical Freeman slit used in the present technology. Two extraction aperture geometries with different respective implications for wafer manipulation during implantation can be used.

1. An essentially circular aperture of perhaps 1 inch in diameter. For this case, wafer manipulation in the subassembly 11 would need to be two-dimensional to provide scanning of the beam over the whole wafer.
2. A highly elongated rectangular aperture, such that the length of the aperture is approximately the diameter of the wafer (up to 30 cm). Proof that such a beam can be extracted and transported resides in the uranium separation program mentioned (the Calutron device). Extraction from such an aperture is sustainable because of the robustness of the cathodic arc source (see below). This idea depends on development of a suitably charged plasma chamber behind the elongated slit. (That chamber may entail other inventions.) By suitable strategies, arc discharges are used to fill the elongated chamber with plasma and containment is provided such that space charge limited (that means Child-Langmuir [18] limited)

extraction is maintained over the whole length (>30 cm) of the extraction slit. The length of the extraction slit, while offering an advantage for treating large diameter wafers, represents more than a simple dimensional change. It has fundamental aspects that keep it from being duplicated by other ion generators. The filament in a Freeman source for example would have to be over 30 cm long and/or the source magnetic field would have to be huge, and the pumping load due to emerging feed gas would be enormous. As part of the target subassembly design (11), wafers are passed through the beam in one dimension as they are "painted" with the long ribbon beam. Uniformity along the length is provided by the Child-Langmuir saturation principle mentioned. It will be noted, as a point of logic, that we are claiming that a similar system was operated, but with a gaseous source for the uranium separation program. In fact, the beam, though very large, was not particularly uniform because of weak ion generation. To avoid the long filament, ionizing electrons were fired in from one end; ion generation was not uniform and was not required to be uniform. The giant magnetic fields required for ion separation and ion source operation required more copper for magnet windings than there was available in the United States at the time, and the silver in Fort Knox had to be used. The pumps for the gas were indeed huge, being some several feet in throat diameter. The present vacuum arc generator facilitates operation of a long-slit source with quite moderate accompanying technologies. The long slit idea permits high average implantation rates while still maintaining normal entry and acceptable rates of local heating for the wafers.

Acceleration voltages in the extraction phase (insulator 3, extraction electrode 4 and chamber 5) can be up to tens of keV. Thus the system provides for ordinary-energy doping, if the ions are not otherwise slowed down upon entering the target subassembly (11). Strategies for slowing down for shallow junction doping will be presented. However, between the ion acceleration stage (components 3,4,5) and the target subassembly (11) is the filter consisting of the biased deflection plates (6,7). The need for the employment of high voltage in the semiconductor application provides the opportunity for this synergistic and uniquely effective MP filter design of the beam deflection principle. It has been noted already that the high voltage associated with the beam generation already amounts to an effective MP filter. This function is made even more effective by the operation of extraction apertures and electrodes as geometric baffles, which limit solid angles of particle entry. The deflection plate principle (embodied in components 6, 7, and 12) will provide the final filtering.

The operation of the deflection plate for ions can be expressed by the simple equation $$V_n/V_a = E_p l/2E_e d,$$

where $V_n$ is the normal velocity imparted by the plates, $V_a$ is the axial velocity imparted by the extraction voltage, (that is the ion velocity coming out of 4), $E_e$ is the extraction voltage (applied by power supply 12) $E_p$ is the plate voltage (also indicated as being supplied by 12), l is the plate length and d is the plate spacing. Thus, to illustrate, if $V_n$ is equal to $V_a$ the bending angle is 45 degrees. The plate voltage is closely coupled to the extraction voltage by the relation given above. Therefore, it has been indicated in the drawing that the same power supply might be used, but that is of course not necessary. Macroparticles, being oppositely charged and very massive, sail right through the beam bender, or are deflected in the opposite direction, and then are trapped by a mechanical arrangement consisting of baffles and soft, damping material on the surfaces. To the extent that they are deflected in the opposite direction, some MP's may collide with the ground plate (6), after which they may rebound, somewhat conservatively in the radial direction, while maintaining their forward velocity. Because of the conservative action, some might collide more than once. Eventually they will have to be trapped in a grounded, baffled, cup. The point of FIG. 14 is to show the separation of ions and MP's. If the "long slit" option (e.g. 30 cm) is used, then the plates are also 30 cm in length into the page in the drawing. That, of course, does not affect the travel length or spacing, l and d.

As an added benefit, the beam steering arrangement is also a filter for any atoms or ions that may be have been sputtered due to any wiping of slits and electrodes during extraction.

The system provides for implantation at high or low energies of boron ions, but functioning in all situations and parameters will not be detailed. The target subassembly, identified as component 11 in the drawing, is partly a "placeholder" representing any of several designs, which function together in various ways with the insulator 10 to facilitate the wafer bombardment. Manifestations could include:

1. A system with wafer translation in two dimensions for beam bombardment.
2. A system with wafer translation in one dimension for beam bombardment (extraction slit of length approximately equal to wafer diameter).
3. A PII chamber.

These three types of systems will borrow much from present practice as far as issues such as wafer manipulation and cooling are concerned. For each of the three, there are two parameter ranges, "shallow junction" and "ordinary energy." Depending on which function is being executed, components will be suitably designed and will come into play in various ways. For these combinations of situations, the insulator (10), the internal and external power supplies and acceleration stages (13), related acceleration/lensing gaps, and referencing to ground will be done in various ways. For example, notice that the anode subassembly (2) has the anode essentially grounded. If the target subassembly were also exactly grounded, hypothetically, then the beam would have been brought back to the target subassembly with virtually zero energy in a conservative way. Although an exactly zero energy is not needed, a low energy is needed for shallow junction doping or perhaps for PII treatment. If the target system (11) is connected across the insulator (10) to the high voltage side (5), the high beam energy is maintained. In that case the usual grounding arrangement would be to have the chambers 5 and 11 near absolute ground and the cathodic arc subsystem (1,2) stood off at high voltage.

The beam system of FIG. 14 can also be used as a feeder subsystem for a PII system. After the PII system is discussed below, that merger will be mentioned again. In that case, the insulator, 10, in FIG. 14 is the same item as 25 in FIG. 15, and the merger is effected at that point.

K2: Plasma Immersion with Partially Directed Plasma.

Figure 15:
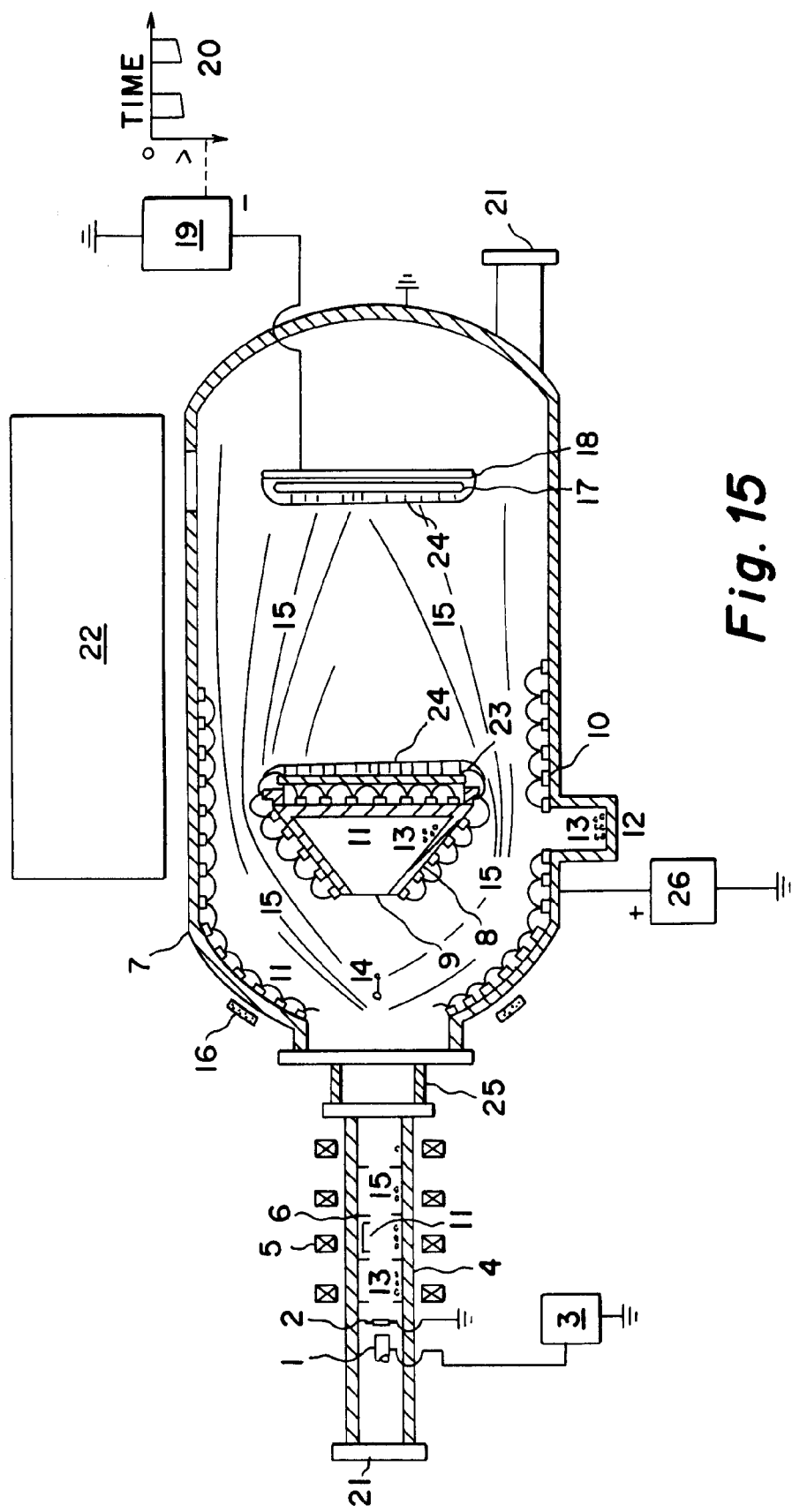
FIGS. 15 and 16 show a diagrammatic view of the invention identifying plasma immersion with partially directed plasma and isotropic plasma, respectively.

FIG. 15 illustrates an approach to plasma immersion implantation. This approach, which we are calling "plasma immersion with partially directed plasma" is the one most closely connected to the laboratory practice behind the present invention. The reference to plasma immersion implantation as a principle was cited (5).

Components (FIG. 15)
1. Boron cathode, part of ion source.
2. Anode, part of ion source
3. Ion source power supply.
4. Plasma flight tube, part of MP filter, vacuum is common with process chamber and ion source.
5. Coil windings (power supply not shown).
6. Mechanical baffles, part of MP filter.
7. Main process chamber, a vacuum chamber.
8. Cone trap, within main chamber.
9. Aperture into cone trap.
10. Cusped magnet system.
11. Damping materials typically on surfaces of baffles, inside and outside of cone trap, part of chamber wall, sump, etc. Materials are vacuum compatible and some are plasma bombardment compatible. They are pliable, flexuarable or allow embedding of MP's. They may be of metal or carbon foams, carbon felt, silicone rubber, polyimide, aluminum foil, etc.
12. Sump for retaining MP's that bounce off of cone trap or chamber wall.
13. MP's trapped in baffle compartments, cone trap, and sump.
14. MP in flight.
15. Streaming plasma.
16. Iron collars.
17. Wafer, or object of treatment.
18. Wafer platen.
19. Target (wafer) bias supply.
20. Pulsed bias concept, voltage time dependency with no positive bias during "down" part of cycle.
21. Vacuum pumping ports, pumping system not shown.
22. Wafer supply and exchange system.
23. Electron mirror, just behind cone trap in this design. In the simplest embodiment the mirror is electrically connected to the wafer platen (18) and receives the same bias history, although the electrical connection is not shown. If the mirror is used, it probably obviates use of cusp magnets on the back of the cone.
24. Plasma sheath boundary for the sample and the mirror.

Operation

Boron plasma generated at the ion source (1,2,3) passes through the anode ring (2) and flies down the flight tube/filter (4). The plasma is confined to a small cylinder of flight down the axis of the tube by the solenoidal type of axial magnetic field enforced by the coils (5). MP's are more divergent than the plasma, not being confined by the field. They encounter a succession of baffles (6), which reflect them backwards and damp them, allowing many to be trapped in the succession of compartments between the baffles. As a result, at the point where the flight tube merges with the chamber (7), only the MP's originally directed within a rather small solid angle remain transmitted in the axial direction of the tube. Most of these enter the large aperture (9) into the cone trap (8) and are trapped. Those that are reflected from the outside surface of the cone are either trapped on the damped surfaces (11) or ultimately roll into the sump (12). Note that all surfaces with which particles have a high probability of colliding, may be coated with damping material, but plasma resistant damping material and non-plasma resistant damping material may be different.

At the juncture of the flight tube to the main chamber, the plasma and the MP's tend to separate for different reasons than in the flight chamber. The MP's, as stated, continue in a straight line to the cone trap because of their momentum. The plasma expands for several reasons. The first is its own pressure, with the magnetic field now relaxed. Secondly, the solenoidal magnetic field, though reduced in intensity, is curling back to return to the coil entrance. Thus, the field now has large radial components, which contribute to the radial expansion of the plasma.

Thus, this filter design has two stages. In the first the plasma is confined and the expanding MP's tend to be trapped in the succession of baffled chambers. In the second, the plasma is expanded as is optimal for process needs, and the then-collimated particles are trapped in the cone trap. Thus, this design provides for MP filtering with expansion of the plasma plume to the dimensions necessary for the wafer.

The directionality and intensity of the magnetic field in the region just after the juncture may also be optimized in part by use of iron collars (16) placed outside the chamber. Most of the plasma would be lost on the chamber walls, however, were it not for the system of cusped magnets (10), which reflect much of the plasma. These magnets provide a much higher local field strength than the solenoidal field. The magnet system also covers the cone trap. Though plasma containment is not perfect (some ions and electrons will run right down the cusps, etc.) the strength of the arc source is such that containment need not be perfect. It is only necessary that the remaining plasma, which bathes the wafer (17), be uniform over the area. Also, modern magnetic materials permit much better containment than would have historically been possible. Therefore, much of the plasma, being reflected from the chamber wall and the cone, drifts around the cone and emerges in the large annular ring of space between the cone and the chamber wall. The plasma then continues to expand as it passes thorough the chamber. Some is reflected from the chamber wall and some not, depending in part on how far the cusped magnet arrangement is extended toward the wafer. The plasma bathes the wafer surface, where boron ions are directly extracted at the desired energy and fluence by the extraction/dosimetry system (19, 20) in accordance with the plasma immersion principle [5]. This means polarization is with respect to plasma potential.

The extraction (as generated by 19) and ion generation (as generated by 3) pulses may be synchronized and phased as desired. There is a possible process advantage to the pulsed extraction concept (as illustrated by 20) with continuous bathing in the plasma. First, we note that a plasma sheath will form over the wafer. The ion flux is independent of the energy over the range from the "natural" sheath voltage of perhaps 40 eV to some possible tens of keV in extraction voltage. Thus, during the low voltage part of the cycle, boron would be deposited essentially as a shallow "coating" in contrast to an "implantation" of significant energy (1 keV to 60 keV). During the high (absolute) voltage part of the cycle this coating would be sputtered off itself. As a result of this continued refluxing of the coating, sputtering of the silicon itself could be ameliorated. In addition, some of the coating would become ion mixed into the silicon. Both of these results would yield higher boron incorporation than might otherwise be attainable. This is a fundamental result. If boron atom surface deposition during the "down" part of cycle is not desired, that can be prevented by applying a slight positive bias during that stage. Attraction of electrons for neutralization would probably be somewhat enhanced if that were done.

In addition, the possible advantage of high implantation rate in reducing sputtering has been identified above Because of the sheath, ion entry to the wafer is automatically perpendicular to the surface (with some qualifications, see below). With beam systems this result must be achieved by sliding vacuum seal arrangements, which traverse the diameter of a wafer. Reference 19 provides important intuitive guidance on expansion of plasmas and reflection by cusped magnets. Plasma containment by use of cusped magnets on the wall is not a new idea, but for this application there are differences worth noting with traditional practice. In the past, total ionization has not been achieved for the plasmas in question. The purpose of the magnets was to only reflect electrons, which would then continue to produce ions among the unionized fraction of gas atoms, thus improving the plasma economy. Modern magnets such as the samarium-cobalt magnets (19) seem to be strong enough reflect atomic ions (more difficult than reflecting electrons), and our plasmas are 100% ionized. These two developments go together naturally.

Spatial aspects are roughly as follows. Width of the annular plasma entrance ring between cone and chamber wall could be about ½ (rough minimum) the wafer diameter. Distance from back of the cone to the wafer surface could be about 2× (rough minimum) the wafer diameter.

Plasma that by-passes the wafer is lost to the chamber wall in the design, particularly in the region on the end towards the wafer, where the cusped magnet system has been terminated. Metal sputtering from that region will be a problem unless ameliorated by one or more techniques. Coating with silicon, as is now the practice on much silicon processing equipment, could be done. Otherwise the system will be self-conditioning due to deposition of boron. There is not necessarily any problem with extending the cusped magnets further along, unless one-bounce boron ions, folded from high angle, contribute to non-uniformity.

The electron-mirror X-ray suppressor (23) may come into play, as needed, during ion implantations at higher voltages (a few keV, e.g.). This need may depend on the voltage, whether the chamber wall is thick enough to shield X-rays, whether there is other shielding and whether there are other controls for the biological hazard. These are the considerations. Boron atoms being accelerated through the plasma sheath at some keV will be accelerated perpendicular to the surface of the target (17) and will cause the ejection of secondary electrons. These secondary electrons, being of opposite charge, will be accelerated perpendicular to the surface back out into the space occupied by the plasma. Because of their extreme velocity, however, in comparison with plasma electrons, they hardly interact with the plasma. Instead they fly through until they strike something at ground potential (which is the same as extraction power supply, 19, anode potential, and essentially the same as plasma potential), where they attenuate their energy in generation of X-rays. In the present case that target would be the back of the cone trap. However, in principle, if a plane piece of material (23) were placed there and brought up to nearly the extraction voltage, then the electrons would be slowed down as they conservatively rode up the sheath potential, and then entered the mirror at such a low energy as to not produce significant radiation. However, the situation is symmetrical. Now, in principle, the mirror (23) might as well be the product itself in that it gets implanted with B ions and also emits electrons, which are then reflected from the target (17). The solution is a controlled take-down of the mutually reflected electrons during the high voltage cycle by suitable irregularities and slight degradations of the voltage pulse (20) with time. These changes with time still allow adequate control of the boron doping profile, while allowing conservative recovery of most of the emitted electrons. The velocity of electrons is such that they make many traverses in the course of, say, a 1 ms pulse.

Taken together, the insulator and power supply (25 and 26 respectively) represent a fine tuning system for ion energy in the plasma. There are three possible advantages to slowing down the ions somewhat from the energy generated by the feeder system (about 40 eV). One is to improve uniformity of spreading into space. The next is for better containment by the cusped magnets. The last is to improve the actual "perpendicularness" for angular entry upon extraction to the target for shallow junction doping. It has been a common claim for PII that the technique produces perpendicular entry. However, suppose the extraction voltage is only 500 V, as was the case above. Let us say that extraction is taking place from a randomly directed ion population of about 40 eV in energy. Then some ions are initially directed normal to the sheath voltage before extraction. The tangent of the entry angle for those ions is $$\tan\theta = \sqrt{40/500}.$$

Thus the entry angle is about 16 degrees. Addition of the subsystem consisting of 25 and 26 may enable empirical biasing of the chamber by a few volts, so as to maximize containment and improve angle of entry. The concept of "partial direction" of the plasma stream, from the start, also helps in regard to the directionality issue.

If the system of FIG. 15 were merged with the beam system, as a feeder, then the front end of the system in FIG. 15 (components 1,2,3,4,5,6,21,etc.) would be dispensed with. Component 25 for the PII system and component 10 for the beam system (FIG. 14) would be the same. The beam would thus be slowed down to ordinary plasma velocities and would thus tend to blow up laterally, as desired. Energy tuning could be applied. To achieve proper bias and establish a plasma potential it might be necessary to put electrons back in by use of a hot filament system (not shown). In any case it is possible to merge the PII system with any of several generation and filtering concepts. Dosimetry has not been dealt with in detail as part of this description. Dosimetry strategies must deal with ion dose and secondary electrons. There are possible strategies and combinations of strategies involving, potentially, Langmuir probes, Faraday cups, or the mirror system. Some are conventional. Some may be synergistic with the present system concept.

Possible wafer or chamber wall cooling are also among the features that have not been depicted.

K3. Plasma Immersion with Isotropic Plasma.

Figure 16:
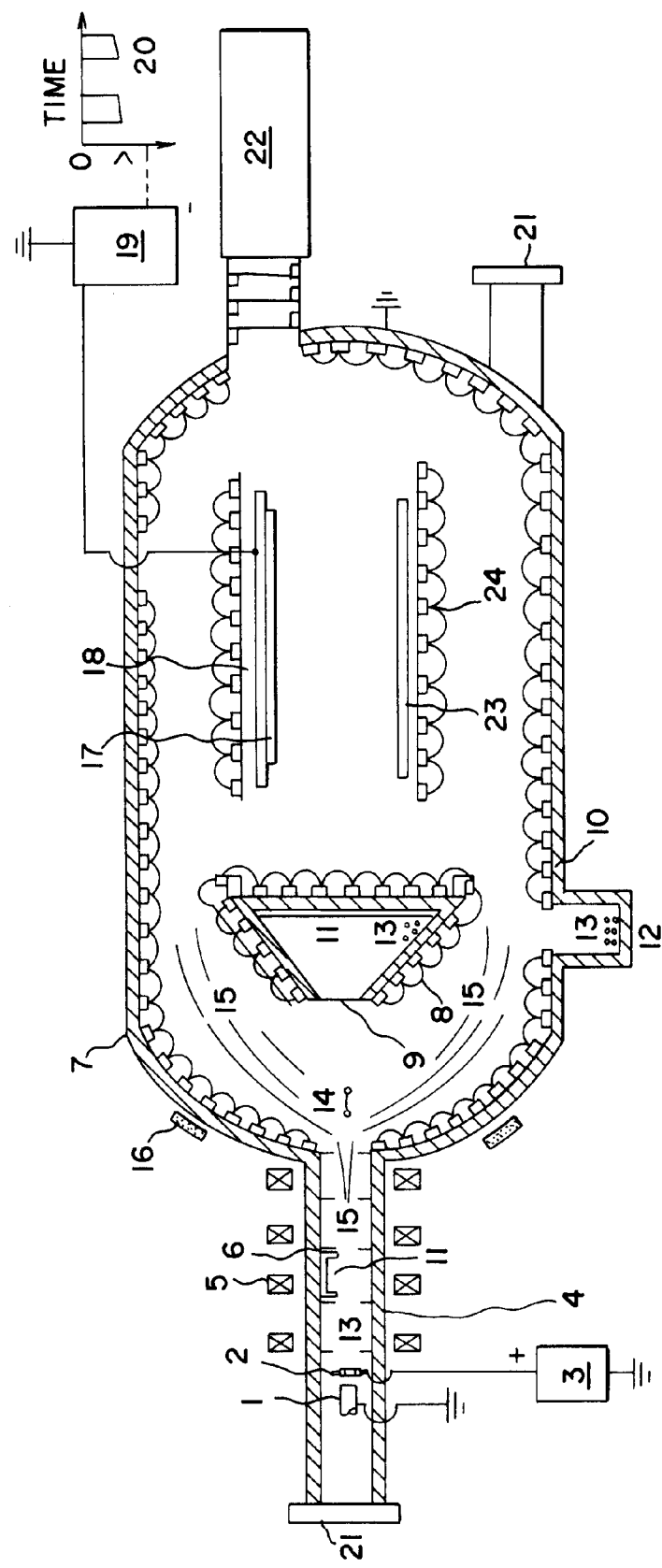

Components (FIG. 16)

Most of the components are the same as for 7a, but a few differences will be noted.

1. The cusped magnet system has been extended to all surfaces of the chamber to promote multiple reflections for isotropy.

17, 18, 23. The product disc, platen, mirror, etc., have been turned horizontal or parallel to chamber axis.

24. The cusped magnet system covers the part of whatever structure is back of the sample platen and mirror.

Operation

Operation is similar to that of K2, except that the basis for uniformity of ion flux on the wafer surface is different from that of K2. The design of K2 provides for an expanding and advancing plasma. In that case, the effective source for expansion is large, that being the annular ring between the cone trap and the chamber wall. Expansion is to such a large area, that the area the wafer cuts off is approximately uniform in flux. There is no return for the plasma that by-passes the wafer and deposits in the back of the chamber.

For K3, the plasma flux is uniform because of multiple reflections from the wall, in concert with the fact that the plasma density is such that there are very few ion-ion or ion-atom collisions, which produce a diffusive type of gradient in the bulk of the chamber. In other words, the mean free path is great, and most of the ions remaining are reflected from the wall. This large mean free path is caused by the fact that there is no appreciable base pressure of non-ionized gas atoms to be collided with. Again, it is not necessary that reflection from the wall be perfect, only that ions remaining have undergone some reflections.

The aspect of the system in the drawing as far as mirror spacing is concerned, or spacing from the walls, is not necessarily realistic.

PUBLICATION REFERENCES

1. S. Morrow, D. E. Schechter, C. C. Tsai, C. C. Klepper, J. Niemel, and R. C. Hazelton, patent applied for. Ser. No. 09/855,160, U.S. Pat. No. 6,562,418, May 13, 2003.
2. F. Richter, G. Krannich, J. Hahn, R. Pintaske, M. Friedrich, S. Schmidbauer, and D. R. T. Zahn, "Utilization of Cathodic Arc Evaporation for the Deposition of Boron Nitride Thin Films," *Surface and Coatings Technology*, 90, 178 (1997).
3. R. L. Boxman, V. Zhitomirsky, B Alterkop, E. Gidalevich, I. Beilis, M. Keidar, and S. Goldsmith, "Recent Progress in Filtered Vacuum Arc Deposition," *Surface and Coatings Technology*, 86-87, 243 (1996).
4. Andre Anders, "Approaches to Rid Cathodic Arc Plasmas of Macro-and Nanoparticles," *Surface and Coatings Technology*, 120-121, 319 (1999).
5. John R. Conrad, United States Patent, "Method and Apparatus for Plasma Source Ion Implantation," U.S. Pat. No. 4,764,394, Aug. 16, 1988.
6. Aitken, Chapter 9, "The Freeman Ion Source", pp 187-205 in The Physics and Technology of Ion Sources, Ed. by Ian G. Brown, John Wiley and Sons, New York, 1989.
7. "Varian Semiconductor Introduces Ultra Low Energy Pulsed-Plasma Doping System," *Business Week*, Jul. 6, 2000.
8. Alexander E. Braun, "Ion Implantation Goes Beyond Traditional Parameters,"*Semiconductor International*, 25, 3, Mar. 2002, pp 48-52.
9. C. C. Klepper, J. Niemel, R. C. Hazelton, E. J. Yadlowsky, and O. R. Monteiro, "Vacuum Arc Deposited Boron Carbide Films for Fusion Plasma Facing Components," *Fusion Technology*, Vol. 39, Number 2 (Mar 2001) pp. 910-915
10. Maria A. Albano, Vijay Babaram, John M. Poate, Marie Sosnowski, and Dale C. Jacobson, "Low Energy Implantation of Boron with Decaborane Ions," *Silicon Front-End Processing—Physics and technology of Dopant-Defect Interactions II, Mat Res. Soc. Symp*. 610, Ed. By Aditya Agarwal, Lourdes Pelaz, Hong-Ha Vuong, Paul Packan, and Masataka Kase, p. B 3.6.1.
11. J. F. Zeigler and J-P Biersack, *SRIM-The Stopping and ranges of Ions in Matter*, Distributed by IBM Company, 2000.
12. A. J. Armini and S. N. Bunker, *Materials Science and Engineering A*, 115, p 67 (1989).
13. Aditya Agarwal, Hans-J. Gossmann, David J. Eaglesham, Dale C. Jacobson, Tony E. Haynes, J. Jackson, Yu E. Erokhin, and John M. Poate, "0.5 to 5 keV Ion Implantation for Ultra Shallow Junctions," *Proceedings of the Ultra Shallow Junction Workshop*, Raleigh, N.C., 1997.
14. Jinning Liu and Sandeep Mehta, "Effect of Ge-Preamorphization on Junction Characteristics for Low Energy B Implants," *Silicon Front-End Processing—Physics and technology of Dopant-Defect Interactions II, Mat Res. Soc. Symp*. 610, Ed. By Aditya Agarwal, Lourdes Pelaz, Hong-Ha Vuong, Paul Packan, and Masataka Kase, p. B 4.6.1.
15. D. Lenoble, A. Halimaoui, A. Grouillet, "Post-Oxidation Enhanced Diffusion of Low-Energy Implanted Boron in Ultra-Shallow P+/N Junction Formation," Ibid, p B 3.9.1.
16. Atsushi Murakoshi, Kyoichi Suguro, Masao Iwase, Mitsuhiro Tomita and Katsuya Okumura, "Cryo-Implantation Technology for Controlling Defects and Impurity Out-Diffusion," Ibid, p 3.8.1.
17. Michael Keidar, Isak I. Beilis, Raymond L. Boxman, and Samuel Goldsmith, "Nonstationary Macroparticle Charging in an Arc Plasma Jet, *IEEE Transactions on Plasma Science*, 23, p 902 (1995).
18. R. Keller, Chapter 3, "Ion Extraction", pp. 23-52 in The Physics and Technology of Ion Sources, Ed by Ian G. Brown, John Wiley and Sons, New York, 1989.
19. M. M. M. Bilek, O. R. Monteiro and I. G. Brown. "Optimization of Film Thickness Profiles Using a Magnetic Cusp Homogenizer," *Plasma Sources Science and technology*, 8, 88 (1999).

The invention claimed is:

1. The method of implanting boron ions into semiconductor materials at specified energies in the absence of a gas or vapor, said method comprising providing a source of boron ions or boron ion plasma where said ions or plasma originate directly from a solid boron material, and wherein said plasma is defined as a state of matter in consisting of ionized cores and free electrons with approximate overall charge neutrality in space, and streaming said ions or plasma against a target semiconductor material and thereby implanting them because of energetics suitable for penetration into the material.

2. The method of claim 1 wherein said boron ions are produced and provided by a plasma plume generated from an electrode of solid and pure boron.

3. The methods as in claim 2 wherein the electrode arc system is operated in either a continuous or pulsed mode.

4. The method of claim 2 wherein the solid electrode from which the plasma originates has been synthesized by use of rf induction heating.

5. The method of claim 2 wherein the solid electrode from which the plasma originates has been synthesized by use of direct current heating.

6. The method of claim 2 wherein the solid electrode from which the plasma originates has been synthesized by use of a microwave heating at a broad range of frequencies.

7. The method of claim 2 wherein the solid electrode from which the plasma originates has been synthesized by chemical precipitation.

8. The method of claim 2 wherein the solid electrode from which the plasma originates has been synthesized by use of pressure assisted sintering with heat.

9. The method of claim 1 wherein said boron ions or plasma plume are produced and provided from a solid electrode of boron compound or boron composite material, such as boron carbide or boron-silicon.

10. The method as in claim 1 wherein said plasma plume is generated by a two-electrode vacuum arc system, known as a cathodic arc system.

11. The method of claim 10 wherein the plasma plume emerges from an arc generated in a vacuum space between two electrodes by application of a suitable voltage between the electrodes with possible application of arc triggering techniques.

12. The method of claim 10 wherein there is an arc in the vacuum space between the electrodes, and the firing and timing of the arc is stimulated by a triggering technique such as laser firing, an external electron gun or inducing a spark.

13. The method of claim 10 wherein there is an arc in the vacuum space between the electrodes and the firing and timing of the arc is stimulated by a triggering techniques such as laser firing and external electron gun or inducing a spark.

14. The method of claim 1 in which the technique of streaming the ions onto the target uses the principle of plasma source ion implantation which means that the target is biased relative to the plasma potential so that boron ions are extracted directly to the target from the plasma across the plasma sheath.

15. The method of claim 1 in which the boron ions are directed to the target by the technique of beam extraction from the plasma and then transport of said beam to the target over distances much larger than the plasma sheath.

16. The method of claim 1 which also includes a way to eliminate macroparticles from the ion stream so as to limit or eliminate impingement or macroparticles onto the target.

17. The method of claim 1 which includes a way or providing for uniform impingement of boron ions with area on the treated surface for targets of various sizes and up to 30 cm. in diameter or greater.

18. The method of claim 1 wherein the target is a silicon wafer or based upon a silicon wafer.

19. The method of claim 1 wherein the target is diamond or contains diamond semiconductor material.

20. The method of claim 1 wherein the target is silicon carbide or contains silicon carbide semi-conducting material.

21. The method of claim 1 wherein the target is germanium or contains germanium semiconductor material.

22. The method of claim 1 wherein the boron ion energies are in the range from 0.2 eV (electron volts) to 300 keV.

23. The method of claim 1 wherein the boron ion doses and energies, together with any subsequent treatments, are designed to produce the result known as "p-doping" of the silicon or other semiconductor material.

24. A process of plasma immersion or plasma source ion implantation, as in claim 23, wherein the plasma that the target is exposed to is of 100% boron atomic content and of a plasma density up to $10^{12}/cm^3$ of boron ions.

25. The method of claim 1 wherein the specified boron ion energy is selected in the range of 100 eV to 2 keV in order to result in the process known as "shallow junction doping" for which p-doping is also implied for shallow junctions.

26. The method of claim 1 wherein a gas my be deliberately introduced into the stream of ions or plasma, possibly in the vicinity of the target, to provide for collisions with boron ions to help randomize the incident ion directions, produce a compound by reaction in the system, to reduce target sputtering by backscattering sputtered atoms, to produce cleaning of the target surface or the like.

27. The method of claim 1 which includes providing the necessary cooling or attenuating the implantation rate, as desired, to achieve the desired low temperature during implantation.

28. The method of claim 1 wherein the ions are first generated and then transported to the target by beam techniques in which the boron atoms are separated from the electrons of the plasma by electrostatic acceleration.

29. The method of claim 1 wherein the beam or plasma may be deflected, steered, or confined by magnets or magnetic fields of various geometries for the purpose of containment of plasma, directing the beam to the particular target, or separation of ions from macroparticles.

30. The method of claim 1 wherein said beam has one or more ion species added from one or more separate ion sources for purposes of growing compounds or growing semiconductor materials with the p-dopant grown in.

31. The method of claim 1 wherein the beam is electrostatically deflected for separation of the beam from macroparticles and including the further step of mechanically trapping the macroparticles.

32. The method of claim 31 wherein the beam, after separation from the macroparticles, has its energy changed before impinging on the target surface.

33. The method of claim 32 wherein the plasma is reconstituted after a slowing down or lowering of energy of the beam.

34. The method as in claim 33, wherein the reconstituted plasma is applied to the surface by the plasma immersion technique.

35. The method of claim 1 wherein the energy of deposition of the boron is so low as to result in a coating instead of an implantation p-doping of the target.

36. The method of ion implantation of boron, wherein every process including steps of providing for generation of plasma and streaming of boron items to the target are conducted with all components in a vacuum, wherein the vacuum precludes deliberate introduction any non-solid matter, in particular gaseous matter, other than the plasma and ions originating in the solid electrode.

* * * * *